(12) United States Patent
Sutono

(10) Patent No.: US 10,607,952 B2
(45) Date of Patent: Mar. 31, 2020

(54) HIGH-DENSITY TRIPLE DIAMOND STRIPLINE INTERCONNECTS

(71) Applicant: Intel Corporation, Santa Clara, CA (US)

(72) Inventor: Albert Sutono, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/116,483

(22) Filed: Aug. 29, 2018

(65) Prior Publication Data

US 2019/0043816 A1 Feb. 7, 2019

(51) Int. Cl.
*H01L 23/528* (2006.01)
*H01L 23/66* (2006.01)
*H01L 23/538* (2006.01)
*H01L 25/065* (2006.01)
*H01P 3/08* (2006.01)
*H01L 23/00* (2006.01)

(52) U.S. Cl.
CPC .......... *H01L 23/66* (2013.01); *H01L 23/528* (2013.01); *H01L 23/5386* (2013.01); *H01L 25/0655* (2013.01); *H01P 3/085* (2013.01); *H01L 23/5383* (2013.01); *H01L 24/16* (2013.01); *H01L 2223/6627* (2013.01); *H01L 2223/6638* (2013.01); *H01L 2224/16225* (2013.01); *H01L 2224/16227* (2013.01); *H01L 2924/19031* (2013.01)

(58) Field of Classification Search
USPC ........................................................ 361/760
See application file for complete search history.

(56) References Cited

U.S. PATENT DOCUMENTS

2019/0069391 A1 2/2019 Sutono
2019/0080999 A1* 3/2019 Eom ................... H01L 23/5223

* cited by examiner

*Primary Examiner* — Andargie M Aychillhum
(74) *Attorney, Agent, or Firm* — Lowenstein Sandler LLP

(57) ABSTRACT

In accordance with embodiments disclosed herein, there is provided a high density triple diamond stripline interconnect. An interconnect includes a first reference layer, a second reference layer disposed below the first reference layer, and a dielectric disposed between the first reference layer and the second reference layer. The interconnect further includes a first pair of conductors including a first conductor and a second conductor that are in a broadside-facing orientation within the dielectric below the first reference layer and above the second reference layer. The interconnect further includes a second pair of conductors including a third conductor and a fourth conductor that are in an edge-facing orientation within the dielectric below the first conductor and above the second conductor.

20 Claims, 11 Drawing Sheets

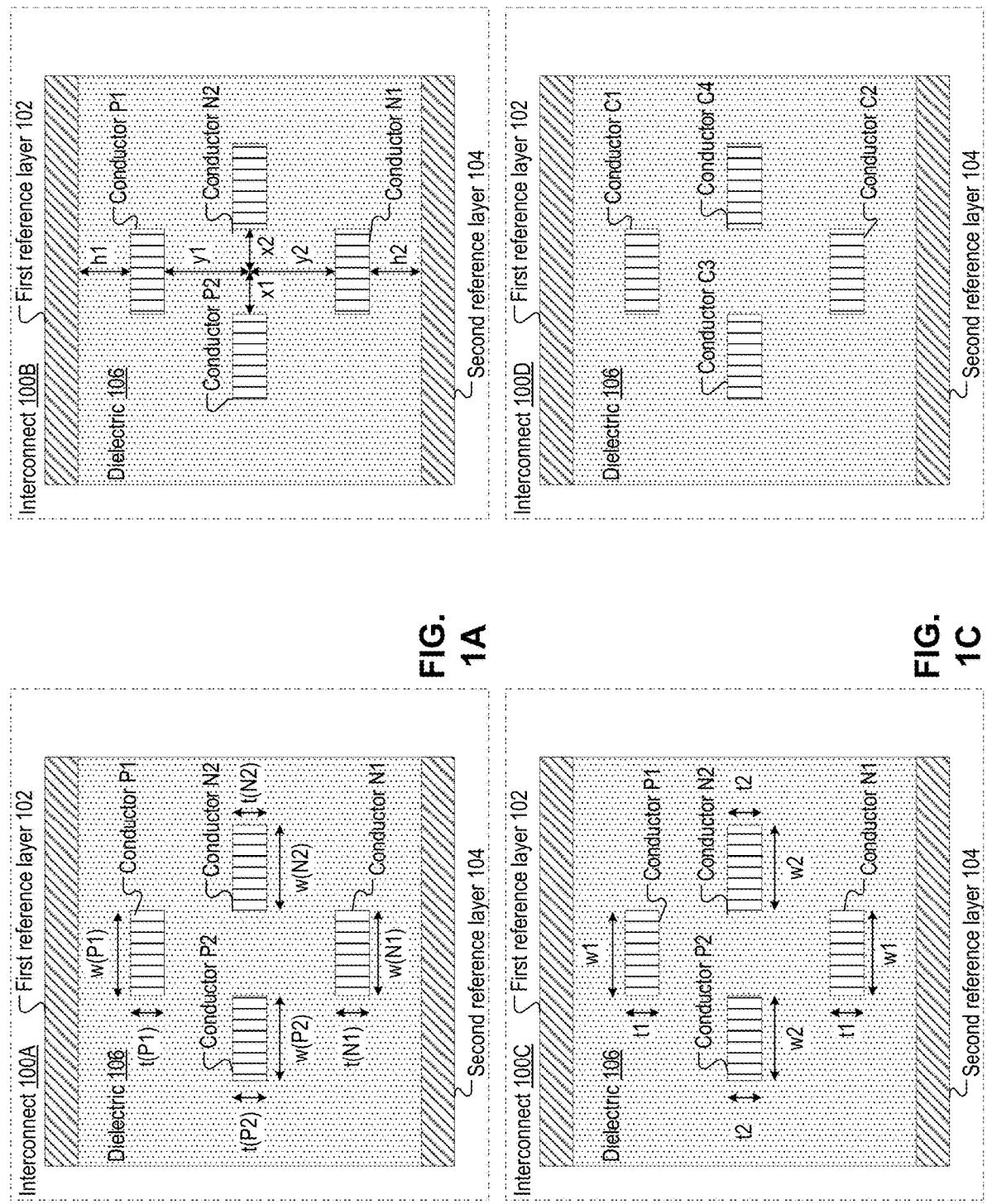

HIGH-DENSITY TRIPLE DIAMOND STRIPLINE INTERCONNECTS

FIGS. 1A-L illustrate cross-sectional views of interconnects that include a first reference layer, a second reference layer, a dielectric disposed between the reference layers, and conductors in a disposed in the dielectric, according to certain embodiments.

FIGS. 2A-D are graphs that illustrate a comparison between a dual-stripline (DS) configuration and a triple diamond stripline (TDS) configuration, according to certain embodiments.

FIGS. 3A-D are graphs that illustrate an electrical performance comparison between a single-stripline (SS) configuration and a TDS configuration, according to certain embodiments.

DESCRIPTION OF EMBODIMENTS

Figure 1E:
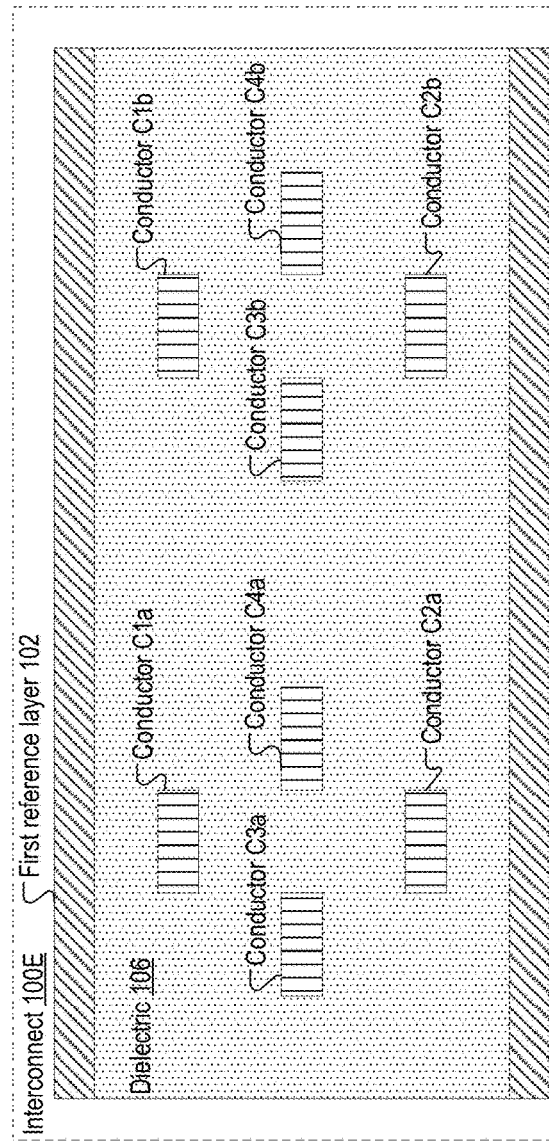

Described herein are technologies directed to high-density triple diamond stripline (TDS) interconnects. As form factors in the computing industry decrease, components are placed closer and closer together and systems (e.g., circuit boards) become smaller. For example, routing layer counts on printed circuit boards (PCBs), integrated circuit dies, integrated circuit packages, and semiconductor packages are generally increased to provide more routing area for conductors. Circuit board thicknesses may be decreased to accommodate smaller volume chassis. These factors lead to a smaller separation between conductors routed on different internal stripline layers of the circuit boards. Consequently, there is less area available to route the conductors which leads to increases in routing densities.

Single-stripline (SS) configuration may refer to a single conductor routed in dielectric between two reference layers (e.g., without conductors routed between the single conductor and either of the reference layers). Multiple conductors may be routed in a SS configuration in the same plane that is disposed between the two reference layers (e.g., dielectric is disposed between the edges of the conductors, the conductors are routed side to side). To increase routing density, conductors may be routed in a dual-stripline (DS) configuration where a first conductor is disposed in the dielectric below a first reference layer, a second conductor is disposed in the dielectric below the first conductor, and the second reference layer is below above the second conductor.

Due to increased routing densities, crosstalk may occur. Crosstalk may be a result of electric and magnetic fields between conductors (e.g., conductors). When a signal is driven onto a conductor, an electromagnetic wave is induced that carries the information from the driver to the receiver. When other signals are routed in the vicinity of driving signal, the electric and magnetic fields intersect the adjacent conductors and induce crosstalk noise in the form of voltages and currents. The increased crosstalk noise degrades signal integrity and leads to functional problems on the conductors that can reduce system performance (e.g., low or failing electrical margins leading to bit errors, broken communication lines, and other functional failures).

To reduce crosstalk, conductors may be offset which requires a larger area (e.g., larger circuit board area) and decreases routing density. For example, increasing the dielectric height between the conductors in DS configuration may decrease crosstalk while decreasing routing density. In another example, routing conductors with an angled offset between the conductors may decrease crosstalk while decreasing routing density. Alternatively, a ground reference (e.g., ground plane) may be placed between the two overlapping conductors to isolate the conductors which requires a larger dielectric thickness to be able to achieve the impedance target of the stripline and decreases routing density (e.g., results in an increased overall thickness of the circuit board). If the middle ground plane is too close to the conductor, the conductor may need to be made narrower to achieve the impedance target, but the conductor width may become narrower than the minimum allowable conductor width and an increased conductor loss (e.g., at high frequencies) may occur due to smaller cross section through which current is to flow.

The devices, systems, and methods, as disclosed herein, provide an interconnect in a high-density TDS configuration. The interconnect (e.g., TDS interconnect, TDS conductor system) may include a first reference layer, a second reference layer disposed below the first reference layer, and a dielectric disposed between the first and second reference layers. The interconnect may further include a first pair of conductors including a first conductor and a second conductor that are in a broadside-facing orientation (e.g., broadside-coupled) within the dielectric below the first reference layer and above the second reference layer. The interconnect may further include a second pair of conductors including a third conductor and a fourth conductor that are in an edge-facing orientation (e.g., edge-coupled) within the dielectric above the second conductor and below the first conductor.

In a given cross-section, each conductor may have a corresponding upper surface, corresponding lower surface, a corresponding first side surface, and a corresponding second side (e.g., of a rectangular cross-section). At the given cross-section, a width of the corresponding upper surface and corresponding lower surface may be greater than a height of the corresponding first side surface and the corresponding second side surface. At the given cross-section, the corresponding upper surfaces and the corresponding lower surfaces may be substantially parallel to one or more of each other, the first reference layer, or the second reference layer. At the given cross-section, the corresponding first side surfaces and the corresponding second side surfaces may be substantially parallel to each other and may be substantially perpendicular to one or more of a corresponding upper surface, a corresponding lower surface, the first reference layer, or the second reference layer.

Due to crosstalk cancelation in the TDS configuration, the first conductor and the second conductor (e.g., broadside-coupled conductors) in TDS configuration may be disposed closer to each other than conductors in the DS configuration. Due to crosstalk cancelation in the TDS configuration, the third conductor and the fourth conductor (e.g., edge-coupled conductors) in TDS configuration may be disposed closer than conductors in the DS and SS configurations. The conductors being disposed closer to each other in the TDS configuration allows higher routing density than DS and SS configurations. The TDS configuration also allows wider conductor width to reduce conductor loss and to meet conductor regulations (e.g., Design for manufacturability (DFM) rules). Both the broadside and edge-coupled conductors may be brought closer together (e.g., not just the broadside-coupled or just the edge-coupled).

FIGS. 1A-J illustrate cross-sectional views of interconnects 100 that include a first reference layer 102, a second reference layer 104, a dielectric 106 disposed between the first reference layer 102 and the second reference layer 104, and conductors disposed in the dielectric 106, according to certain embodiments.

As described herein, the conductors may include conductor P1, conductor N1, conductor P2, and conductor N2. Conductors P1 and N1 may be routed in a broadside-facing orientation (e.g., broadside-coupled configuration). Conductors P2 and N2 may be routed in an edge-facing orientation (e.g., edge-coupled configuration). Conductor P1 may be interchangeable with N1 and conductor P2 may be interchangeable with N2. For example, conductors may be interchangeable when the conductors designate differential configuration (e.g., the conductors P1/N1, P2/N2 carry differential signals).

First reference layer 102 and second reference layer 104 are conducting material. First reference layer 102 and second reference layer 104 may be reference conductors. In some embodiments, the first reference layer 102 and the second reference layer are a ground reference (e.g., at 0 Volt (V) potential; ground layers). In some embodiments, the first reference layer 102 and the second reference layer 104 are not a ground reference. For example, the command, address, and control of double data-rate (DDR) signals may be referenced to a voltage (e.g., supply voltage (VDDQ)) of 1.2V instead of ground. In some embodiments, thickness of the first reference layer 102 and the second reference layer 104 may be substantially the same.

An interconnect 100 may be located in a system. The system may include one or more of a circuit board, a printed circuit board (PCB), a multi-die integrated circuit package, a system on a chip (SoC), silicon or other materials on which integrated circuits are fabricated (e.g., gallium arsenide, indium phosphide, silicon germanium, etc.), flexible circuit interconnects, multi-layer dielectric materials in which there is wiring among different components, etc. The first reference layer 102 and the second reference layer 104 may separate different layers in the system. For example, first reference layer 102 may be disposed on L2, conductors may be disposed on L3 and L4, and second reference layer 104 may be disposed on L5. An interconnect 100 may couple (e.g., connect) one or more components and/or sockets in a system. An interconnect 100 may be used for PCB interconnects (e.g., board interconnects), interconnects on user equipment PCB (e.g., mobile devices), a semiconductor package where multiple dies are connected together, a semiconductor (e.g., silicon interconnects) where devices are connected together on integrated circuit substrates (e.g., silicon, gallium arsenide, silicon germanium, gallium nitride, indium phosphide, etc.).

The conductors disposed in the dielectric 106 include a first pair of conductors (first conductor and second conductor) that are in a broadside-facing orientation (e.g., broadside-coupled) above the second reference layer 104 and below the first reference layer 102 and a second pair of conductors (third conductor and fourth conductor) that are in an edge-facing orientation (e.g., edge-coupled) within the dielectric 106 above the second conductor and below the first conductor.

A lower surface of the first conductor is separated from an upper surface of the second conductor by dielectric. A first edge surface of the third conductor is separated from a second edge surface of the fourth conductor by the dielectric. The first reference layer and the second reference layer may be substantially parallel to each other and the upper surface and the lower surface may be substantially parallel with the first reference layer and the second reference layer. The first edge surface and the second edge surface may be substantially perpendicular to the first reference layer and the second reference layer.

Each conductor has cross-sectional properties of width (w) and thickness (t). The width may be larger than the thickness. Edge-coupled conductors may have edges (e.g., of a thickness (t)) that are substantially parallel to each other. In some embodiments, conductors in a broadside-facing orientation (e.g., broadside-coupled conductors) have corresponding first edge surfaces disposed in a first plane and corresponding second edge surfaces disposed in a second plane. In some embodiments, conductors in an edge-facing orientation (e.g., edge-coupled conductors) have corresponding upper surfaces disposed in a third plane and corresponding lower surfaces disposed in a fourth plane.

In some embodiments, the interconnect 100 in a TDS configuration is used for high-speed cases involving conductors carrying signals that change state (e.g., toggle) frequently. For example, the interconnect 100 in a TDS configuration may be used for clocks running in the megahertz (MHz) frequency and higher (e.g., used to carry a corresponding signal that changes state at a corresponding frequency of at least one MHz). In some embodiments, the interconnect 100 in TDS configuration is used for signals with a corresponding frequency of at least zero MHz or higher (e.g., DC signals such as power rails.) In another example, the interconnect 100 in a TDS configuration may be used for data signals that continuously toggle. In another example, the interconnect 100 in a TDS configuration may be used for static data signals with certain transition times (rise and fall times) that don't toggle periodically. In another example, the interconnect 100 in a TDS configuration may be used for data signals for high-speed protocols such as one or more of Ethernet protocol, double data-rate (DDR), peripheral component interconnect Express® (PCIe®), serial-attached small computer system interface (SCSI)-serial advanced technology attachment (ATA) (SAS-SATA), universal serial bus (USB), or serial peripheral interface (SPI). The distances between the conductors in the TDS configuration may be symmetrical (e.g., see FIGS. 1G-J). In some embodiments, the distances between the conductors in the TDS configuration are not symmetrical. The conductors may have symmetrical dimensions (e.g., see FIG. 1C). In some embodiments, the dimensions of the conductors in the TDS configuration are not symmetrical. The first reference layer 102 and the second reference layer 104 may also be symmetrical with respect conductors (e.g., P1, N1, P2, and N2). In some embodiments, the first reference layer 102 and the second reference layer 104 are not symmetrical with respect conductors (e.g., P1, N1, P2, and N2). For example, in FIG. 1B, h1 may not be equal to h2.

The tolerance of asymmetry allowed (e.g., difference in x, y, h, w, t; how much w(P1) and w(N1), t(P1) and t(N1), w(P2) and w(N2), t(P2) and t(N2) of FIG. 1A may differ; how much x1 and x2, y1 and y2, or h1 and h2 of FIG. 1B may differ; etc.) may depend on factors including speed of the signals the conductors are carrying, lengths of the conductors, amount of discontinuity along the conductors (e.g., vias and connectors). As described herein, substantially equal (e.g., substantially equal dimensions, substantially equal distances, etc.) may include the tolerance of asymmetry. Higher speed, longer length, and more discontinuities translate to smaller tolerance (i.e., the smaller the difference in the spacing and the smaller the difference in the physical parameters of the TDS). In some embodiments, the dimensions x1 and x2, y1 and y2, and h1 and h2 may differ by as much as 10% for SATA signals running at 6 gigabits per second (Gbps) for 15 inches (in) (e.g., substantially equal is within 10% of each other), while the maximum difference may be 3% for Ethernet signals running at 25 Gbps for 8 in (e.g., substantially equal is within 3% of each other). The tolerance specifications may be calculated through simulations for specific interconnects 100 in a TDS configuration for specific protocols and specific interconnect topology (e.g., connectors, vias, etc.).

In some embodiments (e.g., low-speed or static cases), the conductors in TDS configuration carry signals that toggle at low frequencies or static signals. For example, a signal toggling at a low frequency may be a signal of an inter-integrated circuit (I2C) running at 100 kilohertz (kHz). In another example, a static signal is a reset and power-good signals having slow transition time (rise/fall time) in the order of microsecond (μs) and millisecond (ms)). For low frequencies or static signals, there may not be a requirement for symmetry. If the conductors (e.g., P1, N1, P2, and N2 of FIG. 1A-B) transmit static signals, the parameters may be more arbitrary (e.g., x1 and y1 do not have to be equal to x2 and y2, respectively). Although these parameters may be arbitrary, simulations may still be necessary to ensure that crosstalk does not prevent the neighboring signals from functioning properly.

FIG. 1A illustrates a cross-sectional view of an interconnect 100A that includes a first reference layer 102, a second reference layer 104, a dielectric 106, and conductors including conductor P1 (e.g., first conductor), conductor N1 (e.g., second conductor), conductor P2 (e.g., third conductor), and conductor N2 (e.g., fourth conductor), according to certain embodiments. Conductor P1 may have dimensions t(P1) and w(P1), conductor N1 may have dimensions w(N1) and t(N1), conductor P2 may have dimensions w(P2) and t(P2), and conductor N2 may have dimensions w(N2) and t(N2). Conductors P1 and N1 may be broadside-coupled and conductors P2 and N2 may be edge-coupled.

FIG. 1B illustrates a cross-sectional view of an interconnect 100B that includes a first reference layer 102, a second reference layer 104, a dielectric 106, and conductors P1, N1, P2, and N2, according to certain embodiments. Conductor P1 may be a height h1 (e.g., distance) from the first reference layer 102 and conductor N1 may be a height h2 from the second reference layer 104. Conductor P1 may be a distance y1 from the center of the spacing between P2 and N2 to the lower surface of P1. Conductor N1 may be a distance y2 from the center of the spacing between P2 and N2 to an upper surface of N1. The distance between the edge of P2 and x1 is a first fraction of the distance between the edges of P2 and N2. The distance between the edge of N2 and x2 is a second fraction of the distance between the edges of P2 and N2. In some embodiments, the first fraction is substantially equal to the second fraction (e.g., x1 is substantially equal to x2).

In some embodiments, a central point is between the first conductor and the second conductor and a first distance between the third conductor and the central point may be substantially equal to a second distance between the fourth conductor and the central point (e.g., x1 is substantially equal to x2). In some embodiments, a central point is between the third conductor and the fourth conductor and a first distance between the first conductor and the central point is substantially equal to a second distance between the second conductor and the central point (e.g., y1 is substantially equal to y2).

FIG. 1C illustrates a cross-sectional view of an interconnect 100C that includes a first reference layer 102, a second reference layer 104, a dielectric 106, and conductors P1, N1, P2, and N2, according to certain embodiments. In some embodiments, conductor P1 has substantially the same dimensions as conductor N1. For example, conductor P1 may have dimensions w1 and t1 and conductor N1 may have dimensions w1 and t1. In some embodiments, conductor P2 has substantially the same dimensions as conductor N2. For example, conductor P2 may have dimensions w2 and t2 and conductor N2 may have dimensions w2 and t2. In some embodiments, conductors P1, N1, P2, and N2 may have substantially the same dimensions as each other. For example, t1 may be substantially equal to t2 and w1 may be substantially equal to w2.

FIG. 1D illustrates a cross-sectional view of an interconnect 100D that includes a first reference layer 102, a second reference layer 104, a dielectric 106, and conductors C1 (e.g., conductor P1), C2 (e.g., conductor N1), C3 (e.g., conductor P2), and conductor C4 (e.g., conductor N2).

The configuration for each of the four conductors (e.g., conductors) in the TDS configuration may be single-ended striplines (e.g., conductors in a single-ended configuration) or differential striplines (e.g., conductors in a differential configuration). Differential configuration refers to propagating a signal through a pair of conductors having at least one reference. The signals on the two conductors may be equal in magnitude and opposite in polarity of the voltage and current flowing through the conductors. A component (e.g., in a differential circuit) may react to the difference between the signals on the two conductors and reject common-mode noise and therefore, is not affected by the common-mode noise. Single-ended configuration refers to propagating a signal via a single conductor having one reference. Table 1 illustrates different combinations of conductors C1-C4, where S refers to single-ended configuration and D refers to differential configuration.

TABLE 1

| C1 | C2 | C3 | C4 |
|----|----|----|----|
| S  | S  | S  | S  |
| S  | S  | D  | D  |
| D  | D  | S  | S  |
| D  | D  | D  | D  |

Figure 1F:
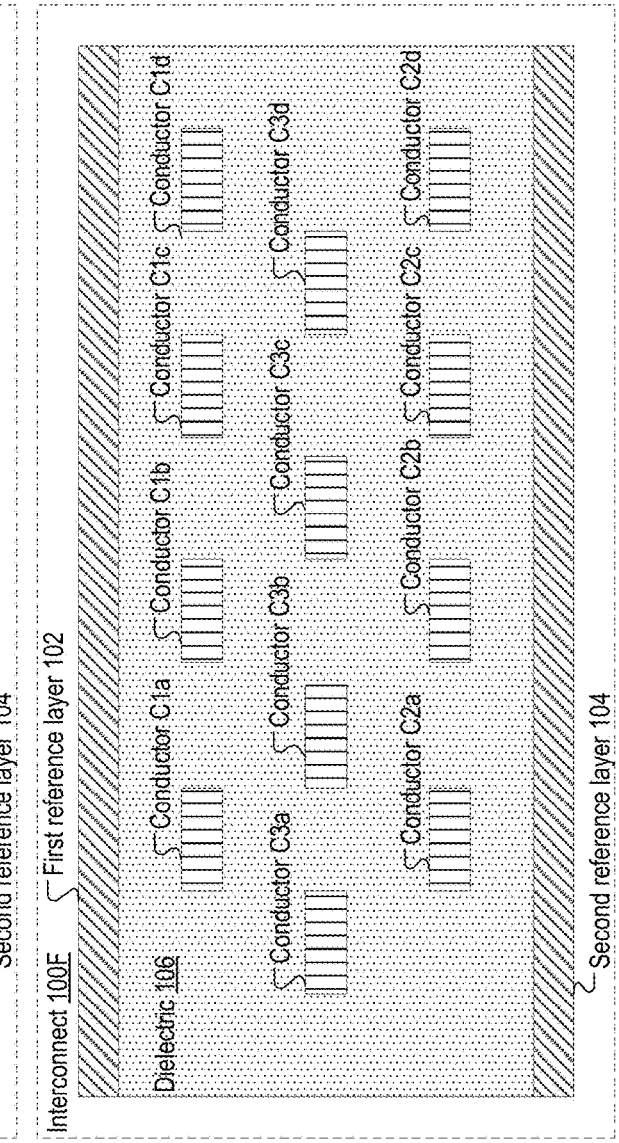

The TDS configuration can be extrapolated to more than four conductors (e.g., see FIGS. 1E-F). The TDS configuration can be extended or repeated in an isolated or conjoined fashion in which each conductor or pair of conductors can be configured as single-ended or differential configuration.

FIG. 1E illustrates a cross-sectional view of an interconnect 100E that includes a first reference layer 102, a second reference layer 104, a dielectric 106, and eight conductors, according to certain embodiments. Conductors C1$a$, C2$a$, C3$a$, and C4$a$ may be in a first TDS configuration and conductors C1$b$, C2$b$, C3$b$, and C4$b$ may be in a second TDS configuration. In interconnect 100E, the diamond cross-sectional pattern is repeated and isolated. Conductors C3$a$, C4$a$, C3$b$, and C4$b$ can take on configurations of DDDD, SSDD, DDSS, SDDS, and SSSS, respectively. Conductors C1$a$, C2$a$, C1$b$, and C2$b$ can take on DDDD, SSDD, DDSS, SDSD, DSDS, and SSSS, respectively. There are thirty possible configurations (e.g., 5×6 from C3a, C4a, C3b, C4b and C1a, C2a, C1b, and C2b, respectively) in the isolated TDS pattern of interconnect 100E.

FIG. 1F illustrates a cross-sectional view of an interconnect 100F that includes a first reference layer 102, a second reference layer 104, a dielectric 106, and twelve conductors, according to certain embodiments. Conductors C1a, C2a, C3a, and C3b may be in a first TDS configuration, Conductors C1b, C2b, C3b, and C3c may be in a second TDS configuration. Conductors C1c, C2c, C3c, and C3d may be in a third TDS configuration. In interconnect 100F, the diamond cross-sectional pattern is repeated and conjoined. In the conjoined TDS pattern of interconnect 100F, there are also five possible combinations for conductors C3a, C3b, C3c, and C3d as in FIG. 1E, namely DDDD, SSDD, DDSS, SDDS, SSSS, but these combinations can be extended to the row of conductors C1a, C1b, C1c, and C1d and the row of conductors C2a, C2b, C2c, and C2d. There are additional vertical possibilities for conductors C1a-d and conductors C2a-d in which a particular vertical pair such as C1a-C2a can be set as differential or single-ended. Therefore, there are 16 abcd (e.g., C1/2a, C1/2b, C1/2c, and C1/2d) configurations: SSSS, SSSD, SSDS, SSDD, SDSS, SDSD, SDDS, SDDD, DSSS, DSSD, DSDS, DSDD, DDSS, DDSD, DDDS, DDDD. The total possible permutations for the conjoined TDS is then 5×5×5×16=2000.

Figure 1G:
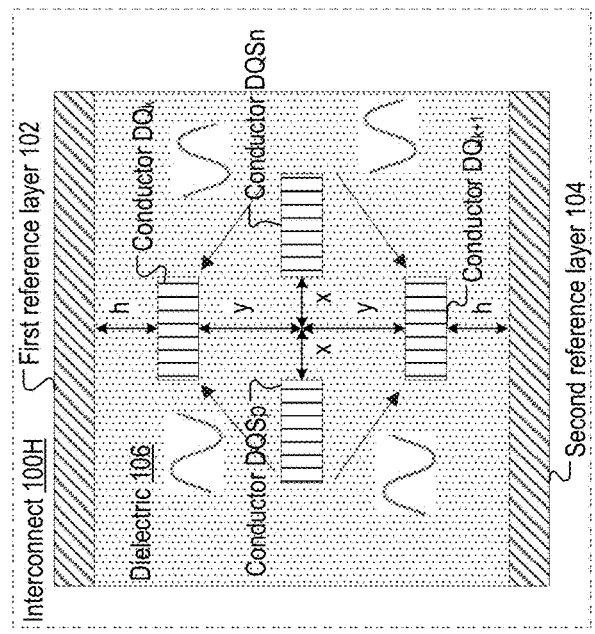

FIG. 1G illustrates a cross-sectional view of an interconnect 100G that includes a first reference layer 102, a second reference layer 104, a dielectric 106, and conductors P1, N1, P2, and N2, according to certain embodiments. In FIG. 1G, first conductor P1 and second conductor N1 are a differential pair routed in a broadside-facing configuration and third conductor P2 and N2 are a differential pair routed in edge-facing configuration. Both pairs are symmetrical to each other (i.e., P1 and N1 are centered around P2 and N2 and vice versa). Crosstalk cancelation occurs between the conductors (e.g., between adjacent conductors). For example, crosstalk cancelation may occur between conductors P1 and N2, conductors N2 and N1, conductors N1 and P2, and conductors P2 and P1. In some embodiments, for crosstalk cancelation to work, P1 is to be an equal distance from P2 and N2 (i.e., at an equal distance x and y to P2 and N2), N1 is to be an equal distance from P2 and N2, P2 is to be an equal distance from P1 and N1, and N2 is to be an equal distance from between P1 and N1. The noise coupling from P1 to P2 and N2 appears as a common mode noise since P1 is at equal distance to P2 and N2 and therefore is rejected by the receiver. The same is true for the noise coupling from N1 to P2 and N2, P2 to P1 and N1, and N2 to P1 and N1. The noise canceling mechanisms may be illustrated by the sinusoid signal representing noise signal and its polarity in FIGS. 1G-1J.

In some embodiments the distance h between conductor P1 and the first reference layer 102 and the distance h between conductor N1 and the second reference layer 104 are not equal (h1 is not equal to h2 in FIG. 1B). The difference between the distances h may cause crosstalk of equal magnitude and polarity (common-mode crosstalk) to be propagated on the differential signals (e.g., on conductors P2 and N2) (e.g., crosstalk noise on a first conductor may equal crosstalk noise on a second conductor). The receiving component will receive the two differential signals (including the equal crosstalk noise on both conductors) on the differential pair of conductors and will cancel out or reject the common-mode crosstalk from P1 and N1.

In some embodiments, the width and/or thickness of the conductors in a differential pair may be different from each other. The differences between the widths and/or thicknesses may cause equal crosstalk to be propagated on the differential signals). The receiving component will receive the two differential signals and will cancel out the common-mode crosstalk from the differential pair. In some embodiments, single-ended conductors are to have substantially the same dimensions as each other. In some embodiments, substantially the same dimensions may be dimensions within 10% of each other. In some embodiments, substantially the same distance may be distances within 10% of each other.

Figure 1H:
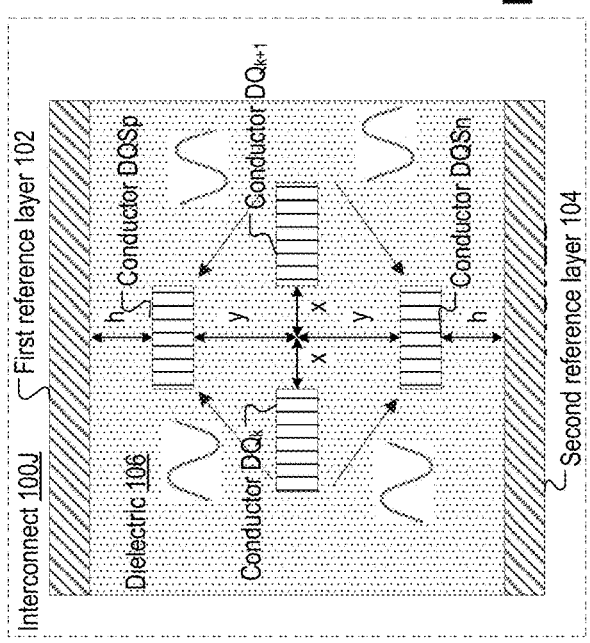

FIG. 1H illustrates a cross-sectional view of an interconnect 100H that includes a first reference layer 102, a second reference layer 104, a dielectric 106, and conductors $DQ_k$, $DQ_{k+1}$, $DQS_p$, and $DQS_n$, according to certain embodiments. The conductors $DQ_k$ and $DQ_{k+1}$ are single-ended and the conductors $DQS_p$ and $DQS_n$ are differential (e.g., a DQ strobe differential pair). In FIG. 1H, the single-ended conductors are in a broadside-facing configuration and the differential conductors are in an edge-facing configuration. The noise from conductors $DQS_p$ and $DQS_n$ may cancel each other at conductors $DQ_k$ and $DQ_{k+1}$.

Figure 1I:
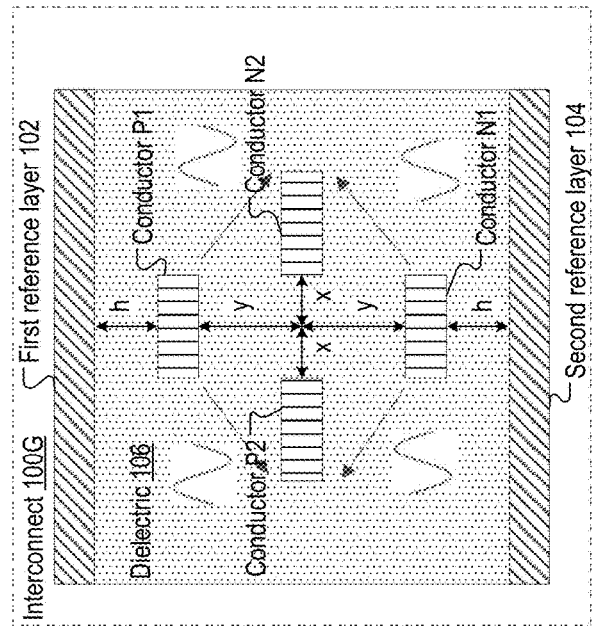

FIG. 1I illustrates a cross-sectional view of an interconnect 100I that includes a first reference layer 102, a second reference layer 104, a dielectric 106, and conductors DQSp, DQSn, $DQ_k$, and $DQ_{k+1}$. The conductors $DQ_k$ and $DQ_{k+1}$ are single-ended and the conductors $DQS_p$ and $DQS_n$ are differential. In FIG. 1I, the differential conductors are in a broadside-facing configuration and the single-ended conductors are in an edge-facing configuration. Single-ended conductors $DQ_k$ and $DQ_{k+1}$ may receive equal magnitude and opposite polarity noise from differential conductors $DQS_p$ and $DQS_n$ and therefore the noise cancels out at $DQ_k$ and $DQ_{k+1}$.

Figure 1J:
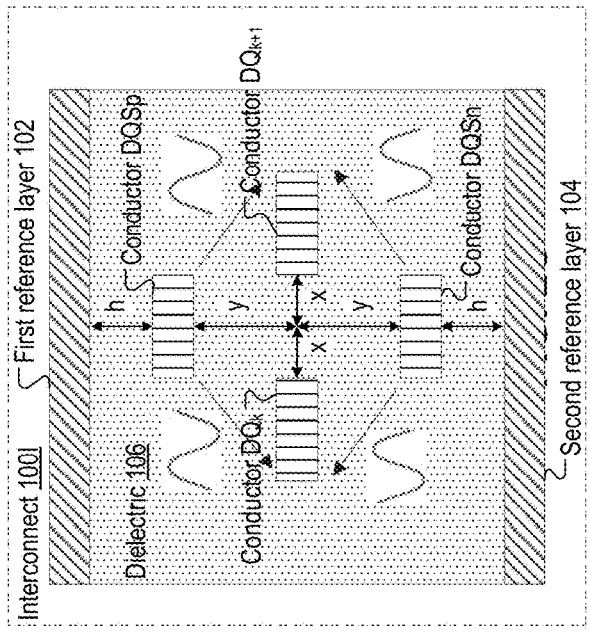

FIG. 1J illustrates a cross-sectional view of an interconnect 100J that includes a first reference layer 102, a second reference layer 104, a dielectric 106, and conductors DQSp, DQSn, $DQ_k$, and $DQ_{k+1}$. The conductors $DQ_k$ and $DQ_{k+1}$ are single-ended and the conductors $DQS_p$ and $DQS_n$ are differential. In FIG. 1J, the differential conductors are in a broadside-facing configuration and the single-ended conductors are in an edge-facing configuration. The noise from $DQ_k$ to $DQS_p$ and $DQS_n$ are equal in magnitude and polarity and therefore is rejected or canceled by the differential conductors $DQS_p$ and $DQS_n$. The same can be said about the noise from $DQ_{k+1}$ to $DQS_p$ and $DQS_n$.

Interconnect 100G illustrates differential noise cancelation of TDS from a differential source (where the noise originates) to a differential victim or to where the noise is coupled. Interconnect 100H and 100I illustrates differential noise cancelation of TDS from a differential source to a single-ended victim. Interconnect 100J illustrates single-ended noise cancelation of TDS from a single-ended source to a differential victim.

Figure 1K:
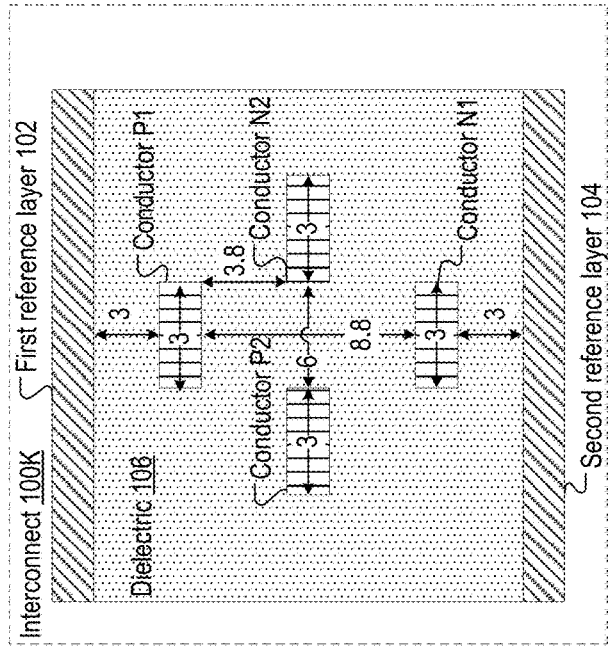

FIG. 1K illustrates a cross-sectional view of an interconnect 100K that includes a first reference layer 102, a second reference layer 104, a dielectric 106, and conductors P1, N1, P2, and N2. FIG. 1K illustrates example dimensions of conductors, distances between conductors, and distances between conductors and reference layers of an interconnect in TDS configuration (e.g., in thousandths of an inch (mils)).

Figure 1L:
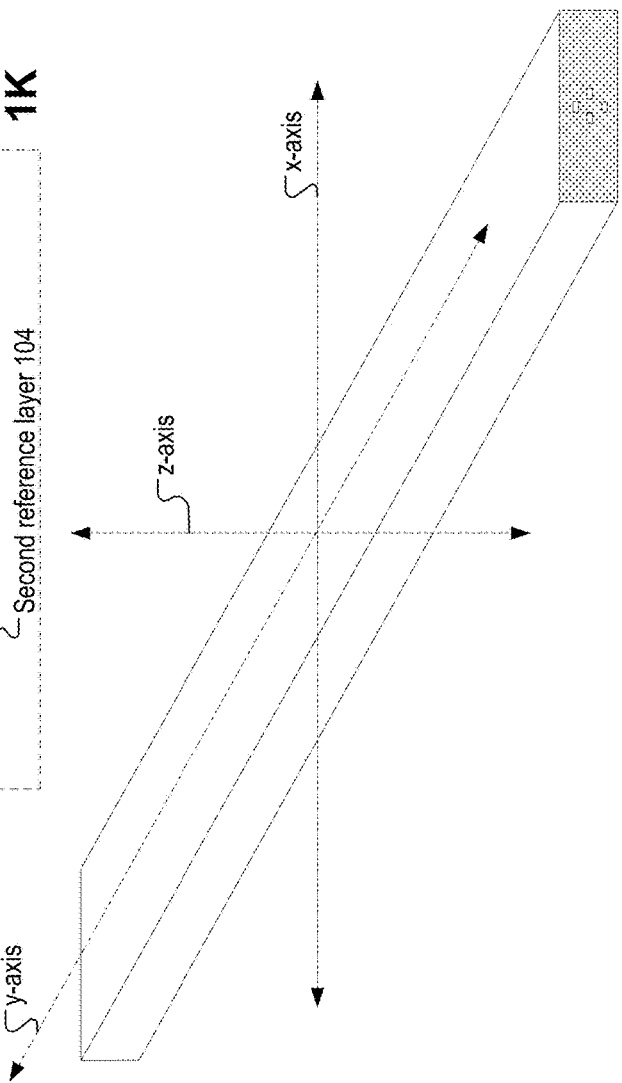

FIG. 1L illustrates a cross-sectional perspective view of an interconnect 100L. In some embodiments, the conductors are routed between reference layers through a system, such as a circuit board, a PCB, a package, a SoC, silicon or other materials on which integrated circuits are fabricated (e.g., gallium arsenide, indium phosphide, silicon germanium, etc.), integrated circuit package, flex interconnects, etc. A surface of the system may be in the x-y plane and depth (thickness) of the system may be in the z-direction.

The system may include a plurality of reference layers that separate different routing or signal layers within the system. Conductors P1, N1, P2, N2, C1, C2, C3, C4, etc. may be signal conductors. In some embodiments, the reference layers are substantially parallel to the surface of the system.

Conductors in the TDS configuration may be oriented from a surface (e.g., top surface, intermediate surface, bottom surface, side surface) of a system, down (in the z-direction) to a depth between two reference layers, and then oriented between the two reference layers until it is oriented up (in the z-direction) to the surface of the system. In some embodiments, the conductors in the TDS configuration are routed between the reference layers in a substantially straight line (e.g., parallel to the x-axis or the y-axis). In some embodiments, the conductors in the TDS configuration may not be routed in a substantially straight line between reference layers. For example, the conductors may be routed at different angles, different curves, around components, in a pattern (e.g., zig-zag), etc. The conductors in the TDS configuration may substantially maintain the same distances between each other over the course of the routing (e.g., h1=h2, y1=y2, x1=x2 in FIG. 1B). In some embodiments, the conductors in the TDS configuration may be maintained at substantially the same relative distances and relative dimensions. For example, as h1 between the first reference layer 102 and conductor P1 increases, h2 between the second reference layer 104 and conductor N1 increases at substantially the same rate to maintain substantially the same relative distances.

FIGS. 2A-D are graphs that illustrate a comparison between a DS configuration and a TDS configuration, according to certain embodiments.

The TDS configuration may be the configuration of interconnect 100K of FIG. 1K that includes a dielectric 106 disposed between a first reference layer 102 and a second reference layer 104. The height between the first reference layer 102 and the conductor P1 is 3 mils (thousandths of an inch). The height between the second reference layer and the conductor N1 is 3 mils. The distance between the conductor P1 and the conductor N1 is 8.8 mils. The distance between conductor P2 and conductor N2 is 6 mils. Conductors P1 and N1 may be centered with respect to conductors P2 and N2.

The DS configuration (e.g., dual-stripline, two conductor layers sandwiched by two reference layers) may also include a dielectric disposed between a first reference layer and a second reference layer. The DS configuration may have a height between the first reference layer 102 and conductors P1 and N1 of 3 mils and a height between the second reference layer and the conductors P2 and N2 of 3 mils. The conductors P1 and N1 may be 8.8 mils from conductors P2 and N2. Conductor P1 may be 6 mils from conductor N1 and conductor P2 may be 6 mils from conductor N2.

Both the TDS configuration and the DS configuration may have the same lateral (horizontal dimensions). For example the width of the conductors may be 3 mils. Both the TDS configuration and the DS configuration may have the same overall dielectric thickness. For example, the overall dielectric thickness may be 17.2 mils. Both the TDS configuration and the DS configuration may have the same length. For example, the length may be 1 in. Both the TDS configuration and the DS configuration may have the same dielectric material and the same copper thickness. For example, the copper thickness may be 1.2 mils (1 ounce). Both the TDS configuration and the DS configuration may have the same reference termination. For example, the reference termination may be 50-Ohm single-ended or 100-Ohm differential. The conductors P1 and N1 may be a differential configuration and the conductors P2 and N2 may also be a differential configuration.

Figure 2A:
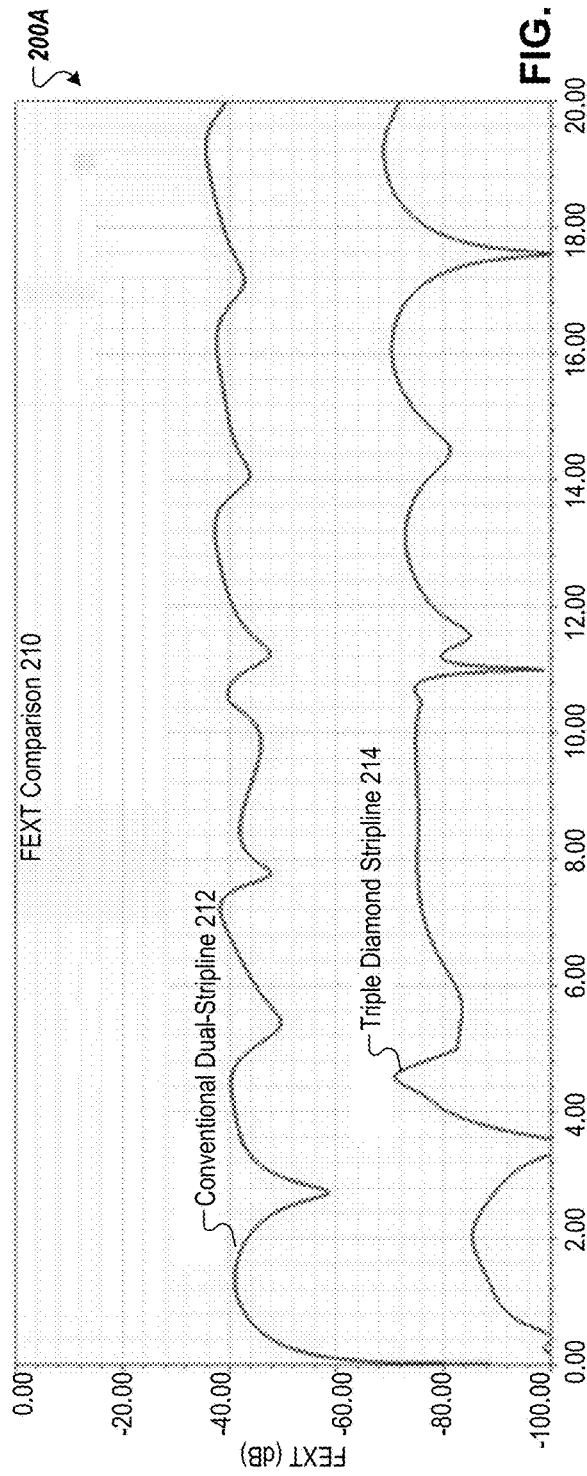

FIG. 2A is a graph that illustrates a far end crosstalk (FEXT) comparison between a DS configuration and a TDS configuration, according to certain embodiments. The TDS configuration has a FEXT of at least 20 decibels (dB) lower than the FEXT of the DS configuration.

Figure 2B:
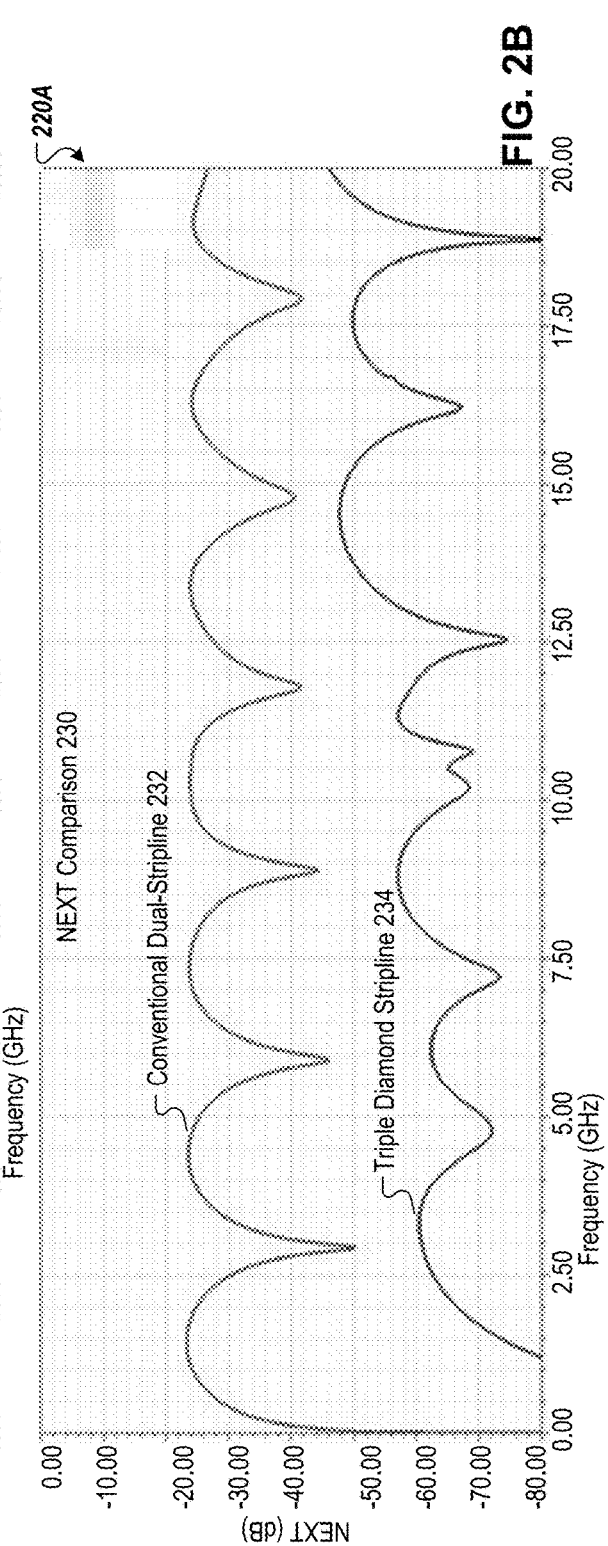

FIG. 2B is a graph that illustrates a near end crosstalk (NEXT) comparison between a DS configuration and a TDS configuration, according to certain embodiments. The TDS configuration has a NEXT of at least 10 dB lower than the NEXT of the DS configuration.

Figure 2C:
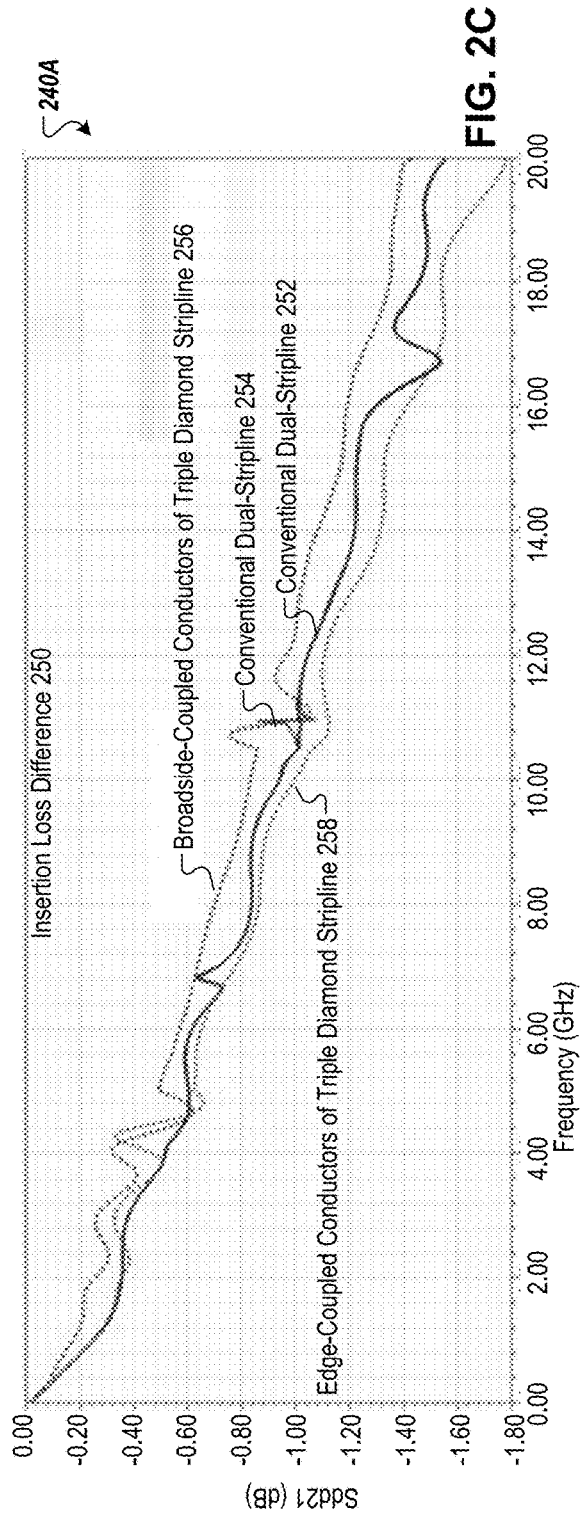

FIG. 2C is a graph that illustrates insertion loss difference between a DS configuration and a TDS configuration, according to certain embodiments. The edge-coupled conductors of the TDS has a maximum of 0.2 dB higher loss (e.g., at 20 GHz) and the broadside-coupled conductors of the TDS has a maximum of 0.1 dB better loss.

Figure 2D:
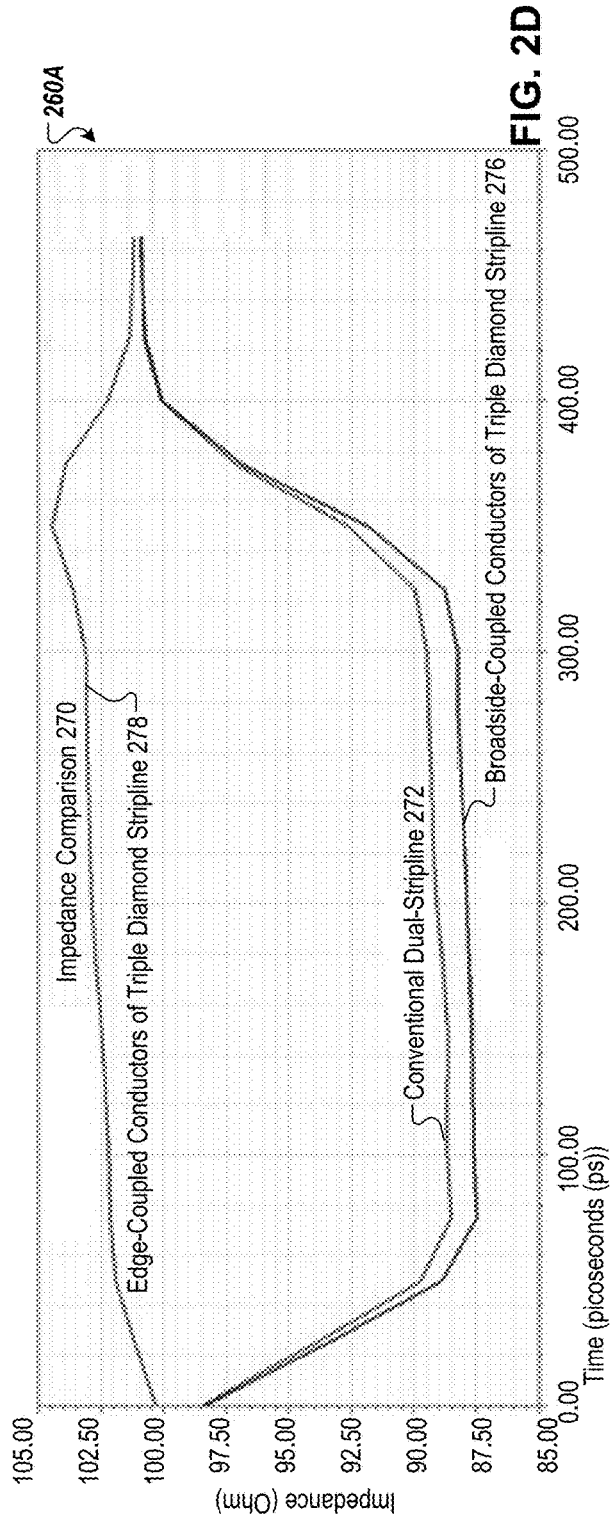

FIG. 2D is a graph that illustrates an impedance comparison between a DS configuration and a TDS configuration, according to certain embodiments. The DS configuration has an impedance of 89-Ohm. The broadside-coupled TDS configuration has an impedance of 87.5-Ohm. The edge-coupled TDS configuration has an impedance of 102-Ohm. For the same conductor width of 3-mils, edge-coupled conductors of the TDS may achieve 100-Ohm impedance while DS conductor width needs to be reduced to less than 3-mils to get 100-Ohm that results in greater conductor loss and may violate DFM rules (e.g., for PCB). The results illustrated in FIGS. 2A-D show benefits of the TDS configuration over DS configuration (e.g., lower FEXT, lower NEXT, etc.).

FIGS. 3A-D are graphs that illustrate a comparison between a SS configuration and a TDS configuration, according to certain embodiments.

The TDS configuration may be the configuration of interconnect 100K of FIG. 1K and of FIGS. 2A-D that includes a dielectric 106 disposed between a first reference layer 102 and a second reference layer 104. The height between the first reference layer 102 and the conductor P1 is 3 mils (thousandths of an inch). The height between the second reference layer and the conductor N1 is 3 mils. The distance between the conductor P1 and the conductor N1 is 8.8 mils. The distance between conductor P2 and conductor N2 is 6 mils. Conductors P1 and N1 may be centered with respect to conductors P2 and N2.

The SS configuration (e.g., single-stripline, single conductor sandwiched by two reference layers) may be the same configuration of the DS of FIGS. 2A-D except that a third reference layer is disposed between the first reference layer and the second reference layer. The third reference layer is disposed between conductors P1 and P2 and between conductors N1 and N2. The SS configuration may have a height between the first reference layer 102 and conductors P1 and N1 of 3 mils and a height between the second reference layer and the conductors P2 and N2 of 3 mils. The SS configuration may have a height of 3.8 mils between the third reference layer and each of the conductors (e.g., corresponding lower surface of conductors P1 and N1 are 3.8 mils from an upper surface of the third reference layer, corresponding upper surfaces of conductors P2 and N2 are 3.8 mils from a lower surface of the third reference layer). Conductor P1 may be 6 mils from conductor N1 and conductor P2 may be 6 mils from conductor N2.

Both the TDS configuration and the SS configuration may have the same lateral (horizontal dimensions). For example the width of the conductors may be 3 mils. Both the TDS configuration and the SS configuration may have the same overall dielectric thickness. For example, the overall dielectric thickness may be 17.2 mils. Both the TDS configuration and the SS configuration may have the same length. For example, the length may be 1 in. Both the TDS configuration and the SS configuration may have the same dielectric material and the same copper thickness. For example, the conductor (e.g., copper) thickness may be 1.2 mils (1 ounce). Both the TDS configuration and the SS configuration may have the same reference termination. For example, the reference termination may be 50-Ohm single-ended or 100-Ohm differential. The conductors P1 and N1 may be a differential port and the conductors P2 and N2 may also be a differential port.

Figure 3A:
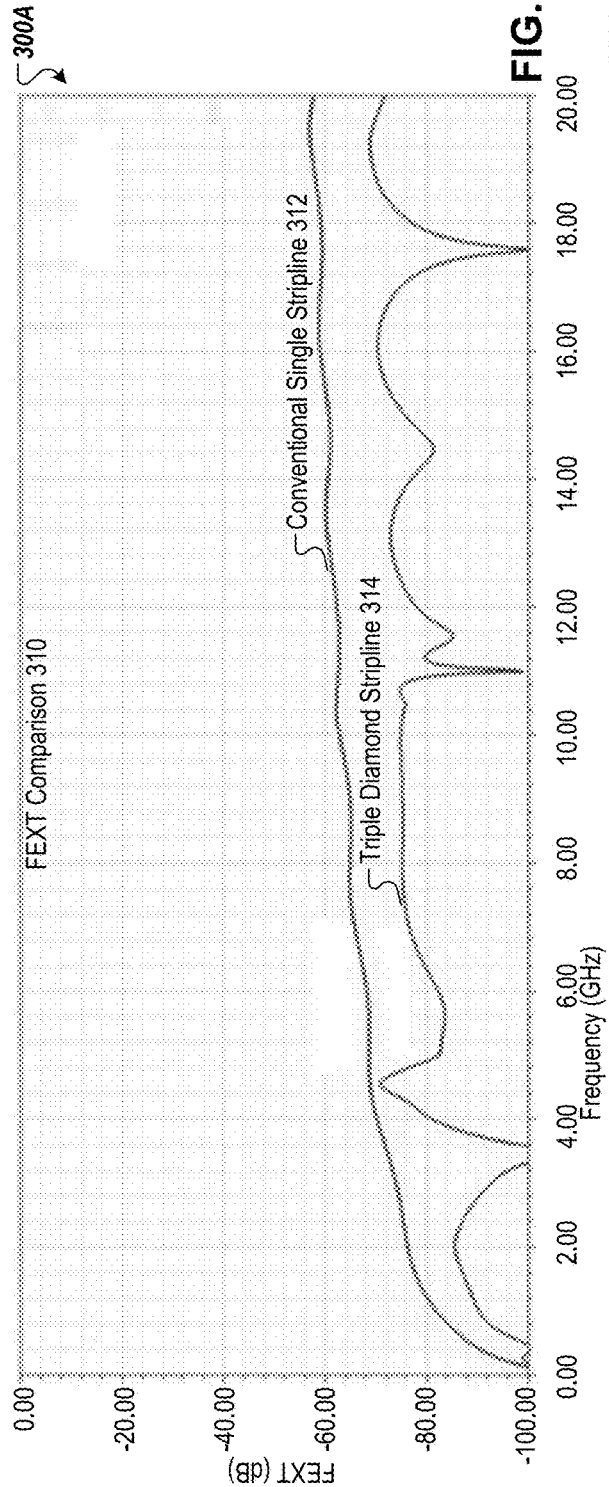

FIG. 3A is a graph that illustrates a far end crosstalk (FEXT) comparison between a SS configuration and a TDS configuration, according to certain embodiments. The TDS configuration has a FEXT that is lower than the FEXT of the SS configuration.

Figure 3B:
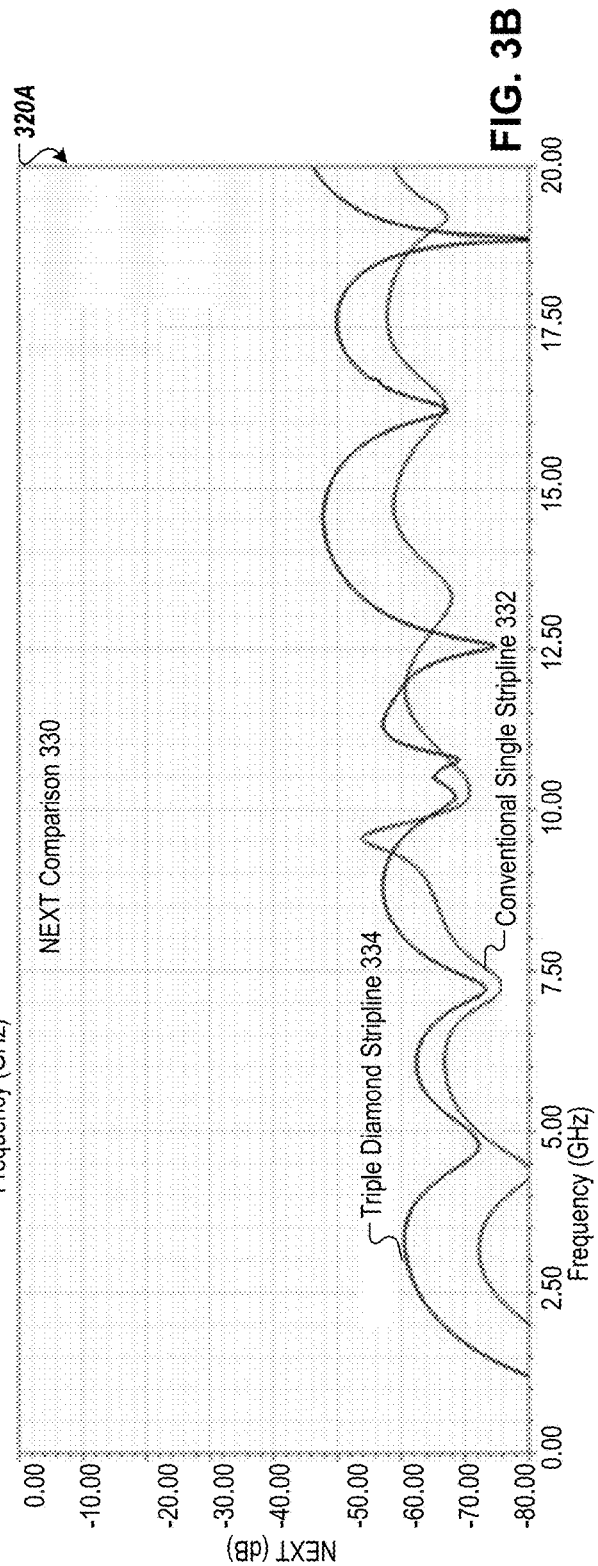

FIG. 3B is a graph that illustrates a near end crosstalk (NEXT) comparison between a SS configuration and a TDS configuration, according to certain embodiments. The TDS configuration has a NEXT that is higher than the NEXT of the SS configuration.

Figure 3C:
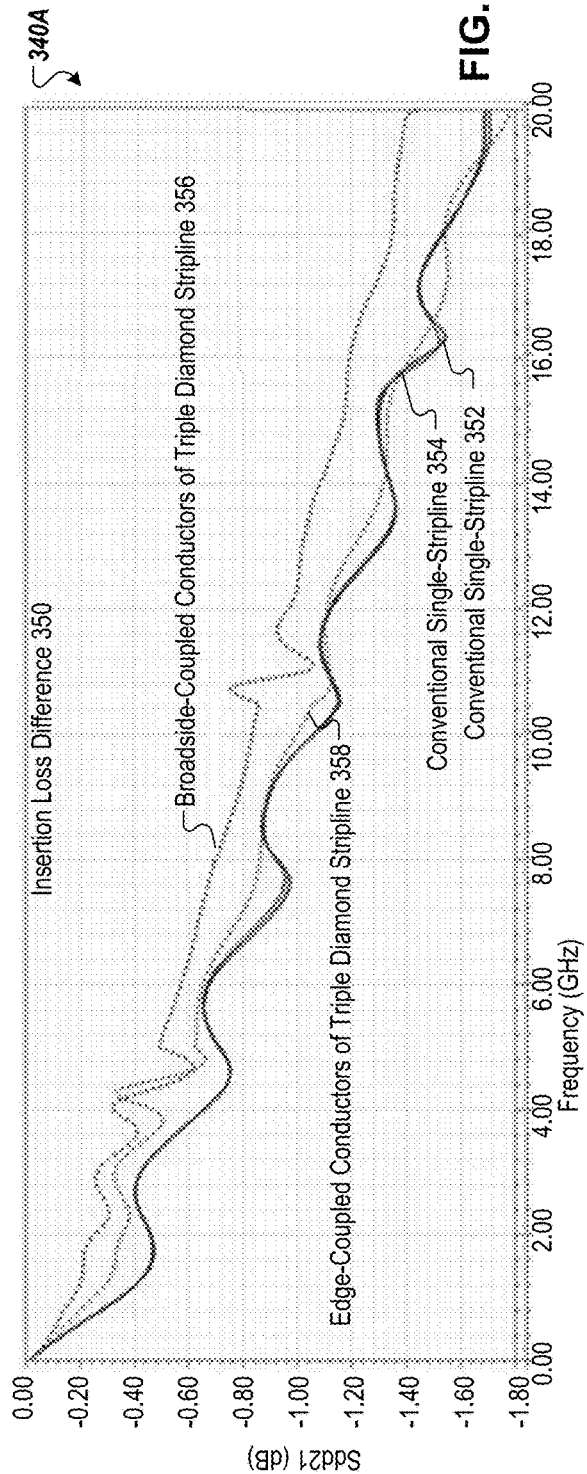

FIG. 3C is a graph that illustrates insertion loss difference between a SS configuration and a TDS configuration, according to certain embodiments.

Figure 3D:
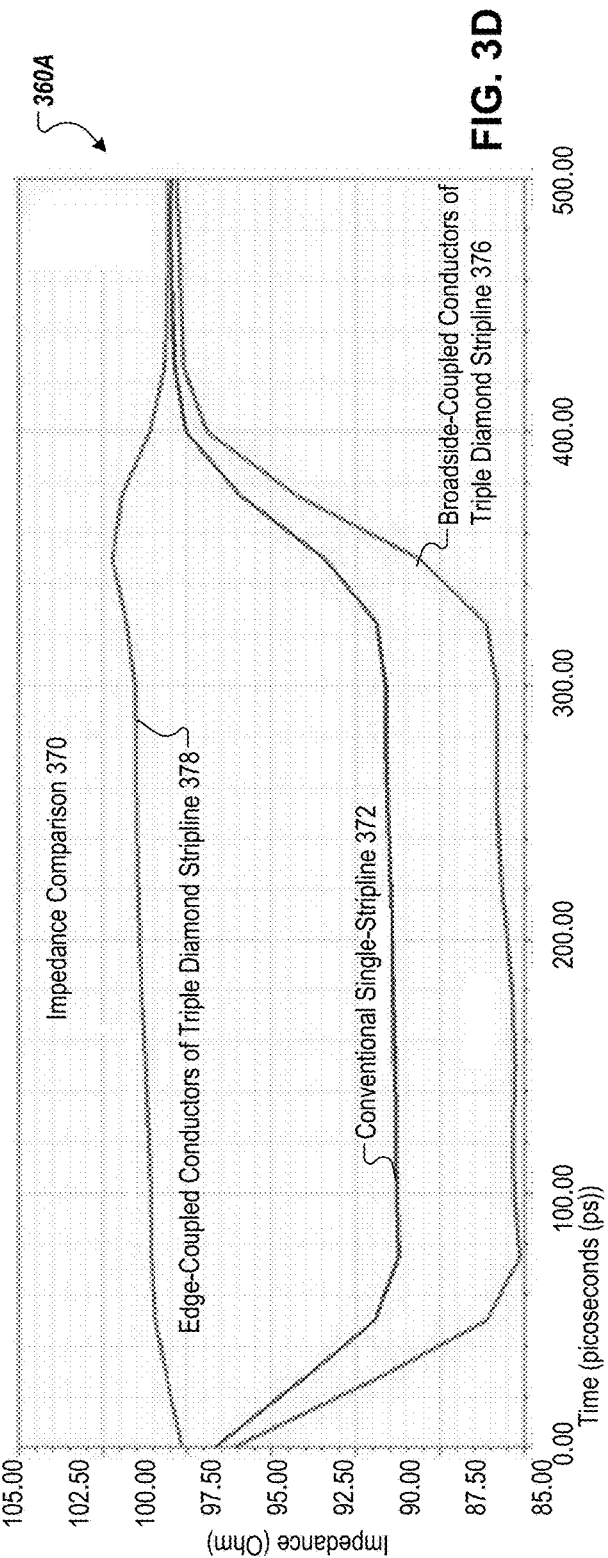

FIG. 3D is a graph that illustrates an impedance comparison between a SS configuration and a TDS configuration, according to certain embodiments. The SS configuration has an impedance of 81-Ohm. The broadside-coupled TDS configuration has an impedance of 87.5-Ohm. The edge-coupled TDS configuration has an impedance of 102-Ohm. For the same conductor width of 3-mils, edge-coupled conductors of the TDS may achieve 100-Ohm impedance while SS conductor width needs to be reduced to less than 3-mils to get 100-Ohm impedance that results in greater conductor loss and may violate DFM rules (e.g., for PCB). Conductor width for conductors in edge-coupled and broadside-coupled TDS configuration can be made wider to achieve lower impedance (e.g., 85-Ohm for PCIe®), while conductors in SS configuration still needs to be narrower since 3-mil conductor width gives 81-Ohm impedance. The results illustrated in FIGS. 3A-D show benefits of the TDS configuration over SS configuration (e.g., lower FEXT, etc.).

Figure 4A:
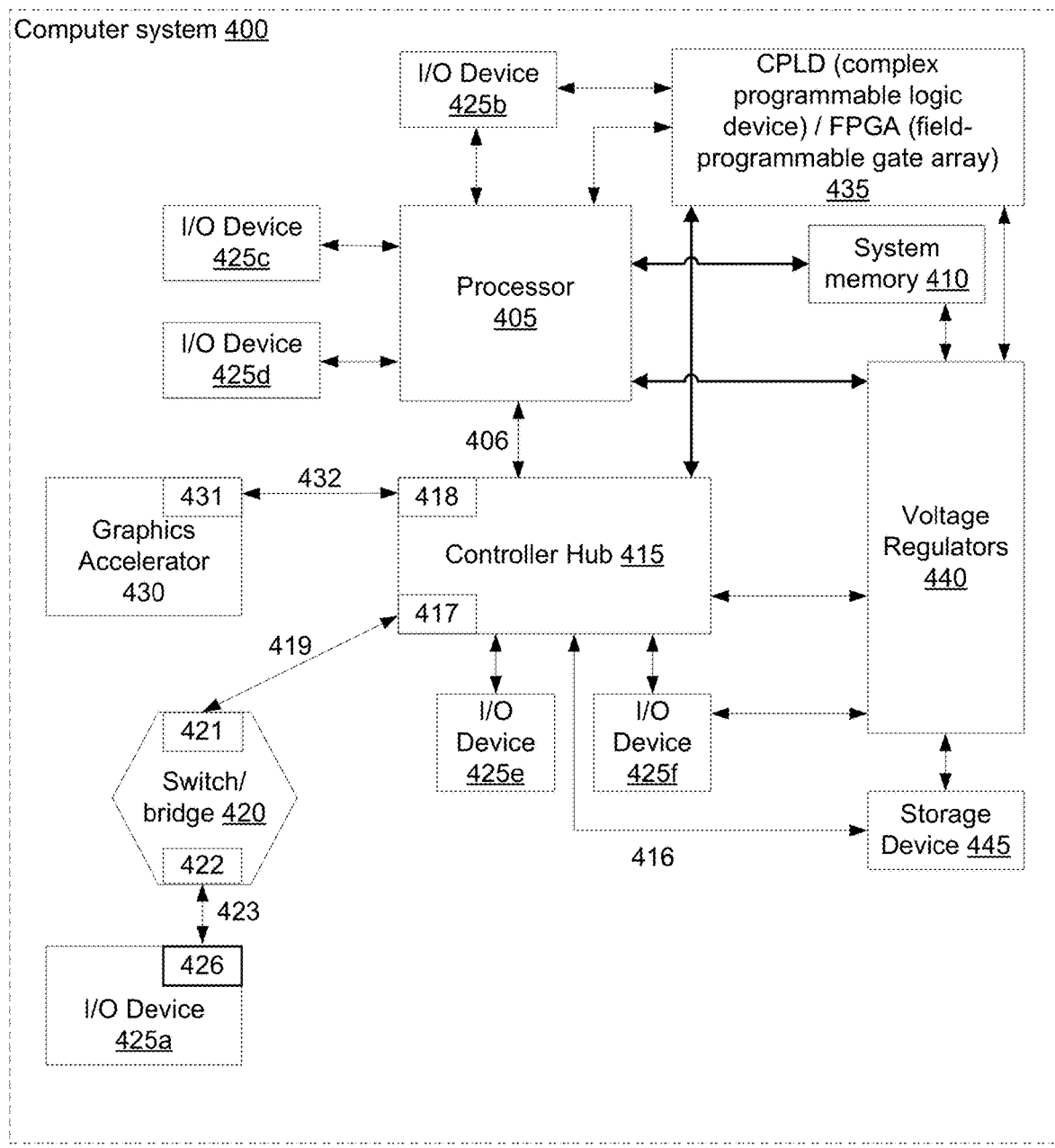
FIG. 4A illustrates a computer system with multiple interconnects, according to certain embodiments.

FIG. 4A illustrates a computer system 400 with multiple interconnects, according to certain embodiments. In some embodiments, system 400 is a printed circuit board (PCB) (e.g., a client motherboard, a server motherboard). TDS (e.g., conductors in the TDS configuration) may be used to connect devices in system 400 (e.g., server, mobile, user, or client PCBs). System 400 includes processor 405, system memory 410, controller hub 415, switch/bridge 420, input/output (I/O) devices 425, graphics accelerator 430, complex programmable logic device (CPLD)/field-programmable gate array (FPGA) 435, voltage regulators 440, and storage device 445. Processor 405 includes any processing element, such as a microprocessor, a host processor, an embedded processor, a co-processor, or other processor. Processor 405 is coupled to controller hub 415 through front-side bus (FSB) 406. In one embodiment, FSB 406 is a serial point-to-point interconnect as described below. In another embodiment, FSB 406 (e.g., link) includes a serial, differential interconnect architecture that is compliant with different interconnect standards.

System memory 410 includes any memory device, such as random access memory (RAM), dynamic RAM (DRAM), non-volatile (NV) memory, non-volatile RAM, (NVRAM), or other memory accessible by devices in system 400. Storage device 445 may include a solid state drive (SSD), a hard disk drive (HDD), or other memory accessible by devices in system 400. System memory 410 is coupled to processor 405. Storage device 445 is coupled to controller hub 415 through memory interface 416. In some embodiments, system memory 410 is coupled to controller hub 415 through a memory interface. Examples of a memory interface include a double-data rate (DDR) memory interface, a dual-channel DDR memory interface, and a dynamic RAM (DRAM) memory interface.

In one embodiment, controller hub 415 is a root hub, root complex, or root controller. Examples of controller hub 415 include a chipset, a memory controller hub (MCH), a north bridge, an interconnect controller hub (ICH) a south bridge, and a root controller/hub. Often the term chipset refers to two physically separate controller hubs, i.e. a memory controller hub (MCH) coupled to an interconnect controller hub (ICH). Note that current systems often include the MCH integrated with processor 405, while controller hub 415 is to communicate with I/O devices, in a similar manner as described below. In some embodiments, peer-to-peer routing is optionally supported through root complex (e.g., controller hub 415).

Here, controller hub 415 is coupled to switch/bridge 420 through serial link 419. Input/output modules 417 and 421, which may also be referred to as interfaces/ports 417 and 421, include/implement a layered protocol stack to provide communication between controller hub 415 and switch 420. In one embodiment, multiple devices are capable of being coupled to switch 420.

Switch/bridge 420 routes packets/messages from I/O device 425 upstream, i.e. up a hierarchy towards a root complex, to controller hub 415 and downstream, i.e. down a hierarchy away from a root controller, from processor 405 or system memory 410 to device 425. Switch 420, in one embodiment, is referred to as a logical assembly of multiple virtual PCI-to-PCI bridge devices. Device 425 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Fire wire device, a Universal Serial Bus (USB) device, a scanner, and other input/output devices. Often in the PCIe® vernacular, such as device, is referred to as an endpoint. Although not specifically shown, device 425 may include a PCIe® to PCI/PCI-X bridge to support legacy or other version PCI devices. Endpoint devices in PCIe® are often classified as legacy, PCIe®, or root complex integrated endpoints.

Graphics accelerator 430 is also coupled to controller hub 415 through serial link 432. In one embodiment, graphics accelerator 430 is coupled to an MCH, which is coupled to an ICH. Switch 420, and accordingly I/O device 425, is then coupled to the ICH. I/O modules 431 and 418 are also to implement a layered protocol stack to communicate between graphics accelerator 430 and controller hub 415. Similar to the MCH discussion above, a graphics controller or the graphics accelerator 430 itself may be integrated in processor 405.

I/O device 425 includes an interface 426 and switch/bridge 420 includes an interface 422. Interface 426 is coupled to interface 422 via serial link 423.

In one embodiment, short range wireless engines including a WLAN unit and a Bluetooth® unit may couple to processor 405 via an interconnect according to a PCIe® protocol, e.g., in accordance with the PCI Express® Specification Base Specification version 3.0 (published Jan. 17, 2004), or another such protocol such as a serial data input/output (SDIO) standard. Of course, the actual physical connection between these peripheral devices, which may be configured on one or more add-in cards, can be by way of the NGFF connectors adapted to a motherboard. Using WLAN unit, Wi-Fi® communications in accordance with a given Institute of Electrical and Electronics Engineers (IEEE) 802.11 standard can be realized, while via a unit using the Bluetooth® technology, short range communications via a Bluetooth® protocol can occur. In another embodiment, these units may communicate with processor 405 via, e.g., a USB link or a universal asynchronous receiver transmitter (UART) link.

The processor 405 may be coupled to one or more of I/O devices 425, controller hub 415, switch/bridge 420, CPLD/FPGA 435, system memory 410, etc. via conductors in a TDS configuration (e.g., TDS to PCB interconnects).

Controller hub 415 and/or switch/bridge 420 may be coupled to one or more corresponding I/O devices 425 via conductors in a TDS configuration (e.g., TDS to PCB interconnects).

CPLD/FPGA 435 may be coupled to one or more of I/O device 425, controller hub 415, switch/bridge 420, or voltage regulators 440 via conductors in a TDS configuration (e.g., TDS to PCB interconnects).

Voltage regulators 440 may be coupled to one or more of I/O device 425, processor 405, system memory 410, switch/bridge 420, controller hub 415, storage device 445, or CPLD/FPGA 435.

One or more of the components of system 400 may be coupled (e.g., connected) by a TDS interconnect (e.g., TDS conductor system) as described herein. For example, one or more of FSB 406, memory interface 416, serial link 419, serial link 423, or serial link 432 may be implemented by conductors routed in a TDS configuration.

In some embodiments, first, second, third, and fourth conductors are in a TDS configuration. A first component may be coupled to a second component via the first conductor and the second conductor in the TDS configuration. A third component and fourth component may be coupled via the third conductor in the TDS configuration and a fifth component may be coupled to a sixth component via the fourth conductor in the TDS configuration.

In some embodiments, first, second, third, and fourth conductors are in a TDS configuration and the first, second, third, and fourth conductors are coupled between a first component and a second component.

In some embodiments, first, second, third, and fourth conductors are in a TDS configuration. A first component may be coupled to a second component via the first conductor, the first component may be coupled to a third component via a second conductor, the first component may be coupled to a fourth component via the third conductor, and the first component may be coupled to a fifth component via the fourth conductor.

Figure 4B:
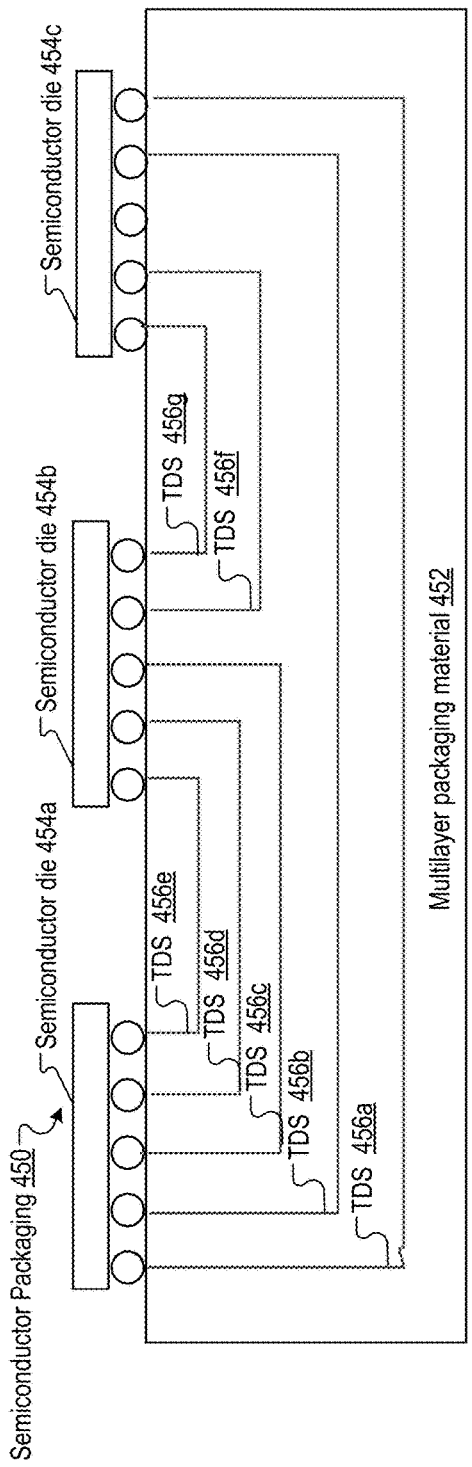
FIG. 4B illustrates semiconductor packaging with multiple interconnects, according to certain embodiments.

FIG. 4B illustrates semiconductor packaging 450 with multiple interconnects, according to certain embodiments. In some embodiments, semiconductor packaging 450 is a printed circuit board (PCB). In some embodiments, semiconductor packaging 450 is a multi-die semiconductor. In some embodiments, semiconductor packaging 450 is an integrated circuit packaging. Conductors in the TDS configuration may be used to connect devices in semiconductor packaging 450. Semiconductor packaging 450 includes semiconductor dies 454 disposed on multilayer packaging material 452. Semiconductor dies 454 may include one or more of a microprocessor, radio frequency integrated circuit, power management integrated circuit, memory devices, analog-mixed signal integrated circuit, or passive devices (e.g., filter antenna, capacitor, resistor, inductor, etc.). Conductors in the TDS configuration (TDS 456) may be routed from a first semiconductor die 454 vertically into the multilayer packaging material 452, then horizontally between reference layers in the multilayer packaging material 452, and then vertically to a second semiconductor die 454. Multiple sets of conductors in the TDS configuration (TDS 456) may be routed from a first semiconductor die 454 to a second semiconductor die 454.

Figure 4C:
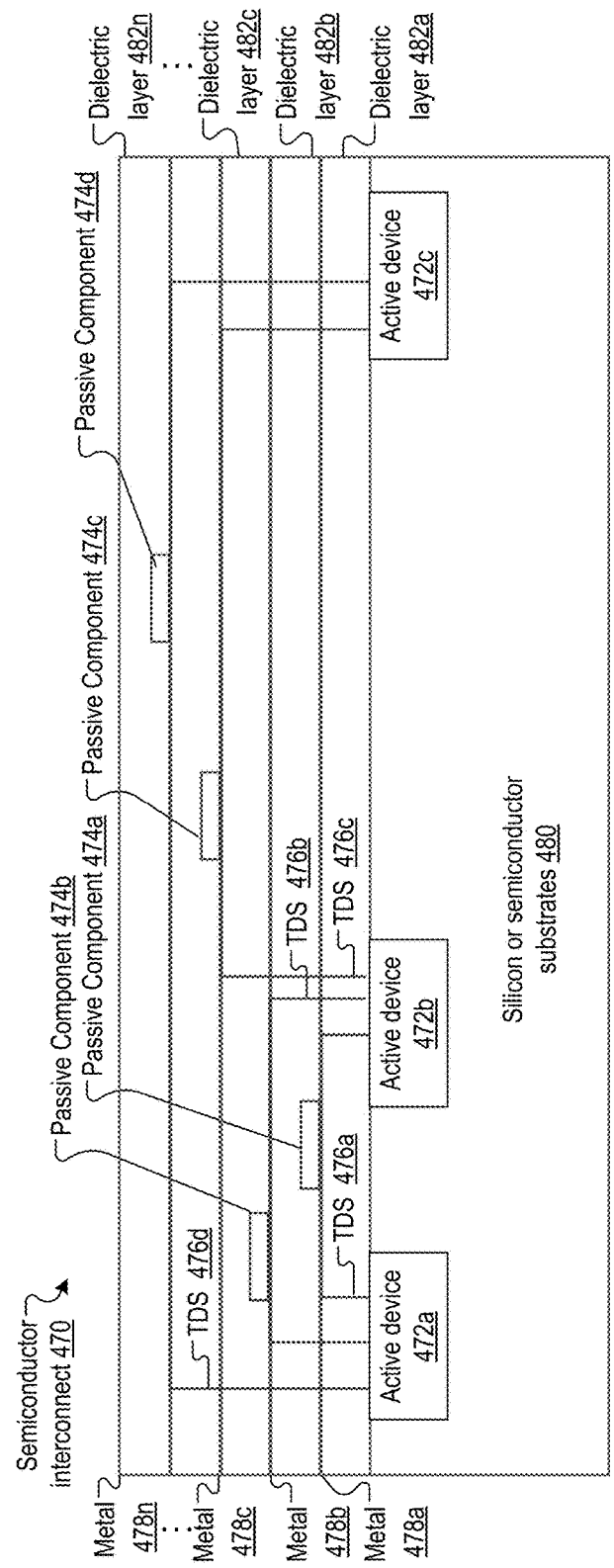
FIG. 4C illustrates a semiconductor interconnect, according to certain embodiments.

FIG. 4C illustrates a semiconductor interconnect 470, according to certain embodiments. In some embodiments, semiconductor interconnect 470 is an integrated circuit (die) interconnect. In some embodiments, semiconductor interconnect 470 includes a silicon or semiconductor substrate 480. Active devices 472 (e.g., transistor, diode, etc.) may be disposed on or in the silicon or semiconductor substrates 480. Dielectric layers 482 may be disposed on the silicon semiconductor substrates 480 and may be separated by metal 478. For example, a first dielectric layer 482a may be disposed on the silicon or semiconductor substrate 480, metal 478a may be disposed on the first dielectric layer 482a, second dielectric layer 482b may be disposed on metal 478a, and metal 478b may be disposed on the second dielectric layer 482b. A passive component (e.g., resistor, capacitor, inductor, etc.) may be disposed in any of the metal layers. TDS (e.g., TDS 476a) may be routed vertically from the active device 472a to any of the metal layers 478a-n to establish connection to other metal layers 478a-n, other active devices 472b-c, or passive components 474a-d. Each active device 472 may be coupled to multiple passive components 474b via different sets of conductors routed in the TDS configuration (TDS 476). TDS can also be used to connect passive components to passive components or from one metal layer to another (e.g., TDS does not need to be strictly from or to active devices). In some embodiments, TDS may be implemented in any of the metal 478a-n (e.g., a horizontal portion of TDS 476 may be part of a corresponding metal 478). In some embodiments, metal 478 may be a reference layer. In some embodiments, the reference layers are not shown in FIG. 4C.

Figure 5:
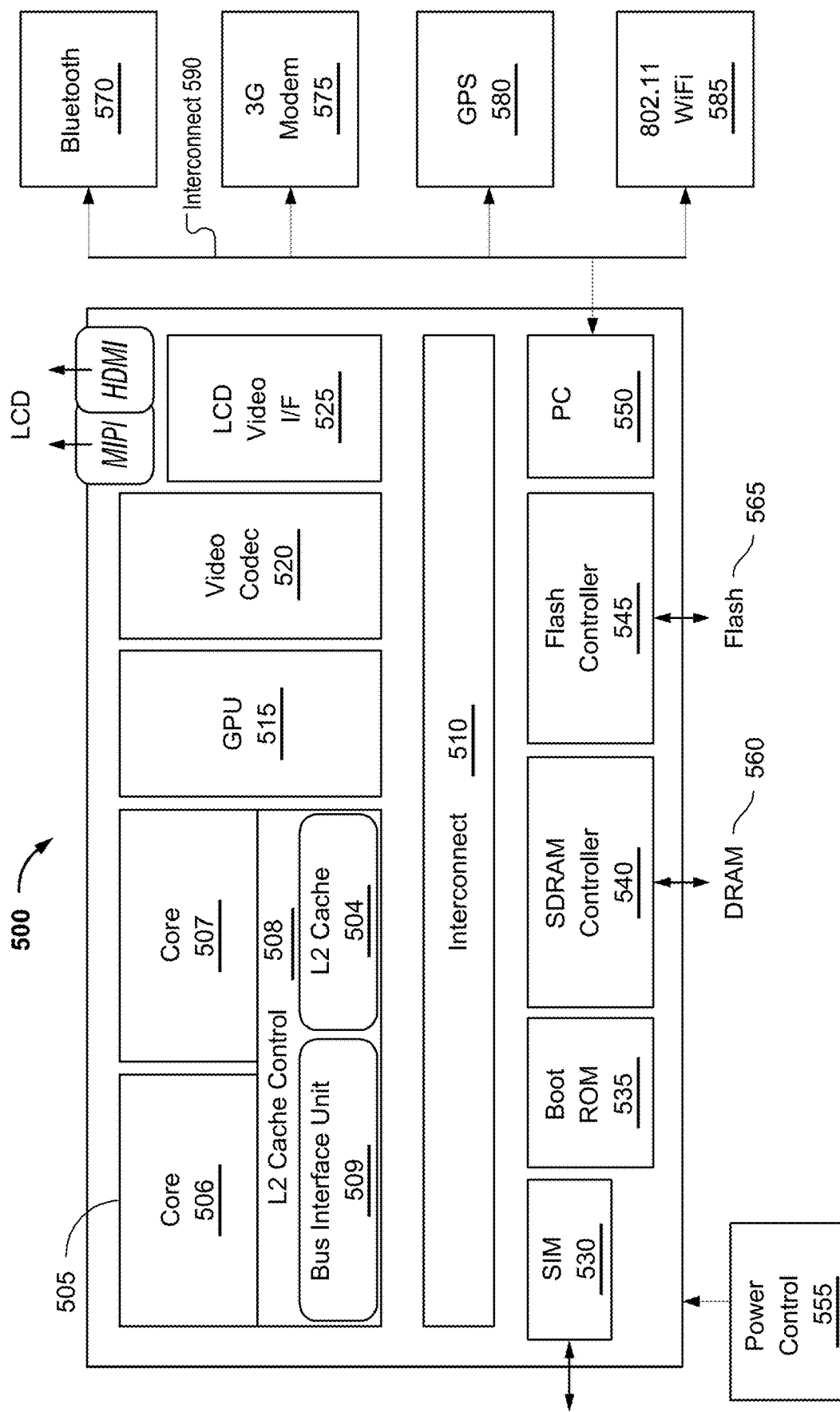
FIG. 5 illustrates a system on a chip (SOC) design, according to certain embodiments.

Turning next to FIG. 5, an embodiment of a system 500 including a system on-chip (SOC) 505 design in accordance with the disclosures is depicted. As a specific illustrative example, system 500 is included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SOC 505 includes 2 cores—506 and 507. Similar to the discussion above, cores 506 and 507 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 506 and 507 are coupled to cache control 508 that is associated with bus interface unit 509 and L2 cache 504 to communicate with other parts of system 500. Interconnect 510 includes an on-chip interconnect, such as an IOSF, AMBA, or other interconnect discussed above, which potentially implements one or more aspects of the described disclosure. Interconnect 510 may connect all devices or components in SOC 505 to each other (e.g., core 506 to GPU 515, video codec 520 to LCO video I/F 525, etc.).

Interconnect 510 (e.g., interface) provides communication channels to the other components, such as a Subscriber Identity Module (SIM) 530 to interface with a SIM card, a boot rom 535 to hold boot code for execution by cores 506 and 507 to initialize and boot system 500 or SOC 505, a SDRAM controller 540 to interface with external memory (e.g. DRAM 560), a flash controller 545 to interface with non-volatile memory (e.g. Flash 565), a peripheral control 550 (e.g. Serial Peripheral Interface) to interface with peripherals, video codecs 520 and Video interface 525 to display and receive input (e.g. touch enabled input), GPU 515 to perform graphics related computations, etc. Any of these interfaces may incorporate aspects of the disclosure described herein.

In some embodiments, interconnect 510 may be interconnect 100 of one or more of FIGS. 1A-L. Interconnect 510 may include conductors in a TDS configuration to couple one or more components of system 500 or SOC 505.

In addition, the system illustrates peripherals for communication, such as a Bluetooth® module 570, 3G modem 575, GPS 585, and Wi-Fi® 585. Note as stated above, a UE includes a radio for communication. As a result, these peripheral communication modules are not all required. However, in a UE some form a radio for external communication is to be included. Conductors in a TDS configuration may be implemented in interconnect 510 and may be implemented from 505 to other devices (e.g., 570, 575, 580, 585) (e.g., via interconnect 590).

The following examples pertain to further embodiments.

Example 1 is an interconnect comprising: a first reference layer; a second reference layer disposed below the first reference layer; a dielectric disposed between the first reference layer and the second reference layer; a first pair of conductors comprising a first conductor and a second conductor that are in a broadside-facing orientation within the dielectric below the first reference layer and above the second reference layer; and a second pair of conductors comprising a third conductor and a fourth conductor that are in an edge-facing orientation within the dielectric below the first conductor and above the second conductor.

In Example 2, the subject matter of Example 1, wherein the first conductor and the second conductor are differential striplines; the third conductor and the fourth conductor are differential striplines; first dimensions of the first conductor are substantially equal to second dimensions of the second conductor; and third dimensions of the third conductor are substantially equal to fourth dimensions of the fourth conductor.

In Example 3, the subject matter of any one of Examples 1-2, wherein the first conductor and the second conductor are differential striplines; the third conductor and the fourth conductor are single-ended striplines; first dimensions of the first conductor are substantially equal to second dimensions of the second conductor; and third dimensions of the third conductor are different from fourth dimensions of the fourth conductor.

In Example 4, the subject matter of any one of Examples 1-3, wherein a first distance between the first reference layer and the first conductor is substantially equal to a second distance between the second reference layer and the second conductor.

In Example 5, the subject matter of any one of Examples 1-4, wherein a central point is between the first conductor and the second conductor, wherein a first distance between the third conductor and the central point is substantially equal to a second distance between the fourth conductor and the central point.

In Example 6, the subject matter of any one of Examples 1-5, wherein a central point is between the third conductor and the fourth conductor, wherein a first distance between the first conductor and the central point is substantially equal to a second distance between the second conductor and the central point.

In Example 7, the subject matter of any one of Examples 1-6, wherein: the first conductor and the second conductor are substantially centered about the third conductor and the fourth conductor; the third conductor and the fourth conductor are substantially centered about the first conductor and the second conductor; and the first reference layer and the second reference layer are substantially symmetrical.

In Example 8, the subject matter of any one of Examples 1-7, wherein: a lower surface of the first conductor is separated from an upper surface of the second conductor by the dielectric; a first edge surface of the third conductor is separated from a second edge surface of the fourth conductor by the dielectric; the upper surface and the lower surface are substantially parallel with the first reference layer and the second reference layer; and the first edge surface and the second edge surface are substantially perpendicular to the first reference layer and the second reference layer.

In Example 9, the subject matter of any one of Examples 1-8, wherein each of the first conductor, the second conductor, the third conductor, and the fourth conductor is to carry a corresponding signal that changes state at a corresponding frequency of at least one megahertz (MHz).

In Example 10, the subject matter of any one of Examples 1-9, wherein the first conductor and the second conductor are broadside-coupled, and wherein the third conductor and the fourth conductor are in edge-coupled.

Example 11 is a system comprising: a first component; a second component; and a conductor system coupled between the first component and the second component, wherein the conductor system comprises: a first reference layer; a second reference layer disposed below the first reference layer; a dielectric disposed between the first reference layer and the second reference layer; a first pair of conductors comprising a first conductor and a second conductor that are broadside-coupled within the dielectric below the first reference layer and above the second reference layer; and a second pair of conductors comprising a third conductor and a fourth conductor that are edge-coupled within the dielectric below the first conductor and above the second conductor.

In Example 12, the subject matter of Example 11, wherein: the first conductor and the second conductor are differential striplines; the third conductor and the fourth conductor are differential striplines; and first dimensions of the first conductor are substantially equal to second dimensions of the second conductor, wherein third dimensions of the third conductor are substantially equal to fourth dimensions of the fourth conductor.

In Example 13, the subject matter of any one of Examples 11-12, wherein: the first conductor and the second conductor are differential striplines; the third conductor and the fourth conductor are single-ended striplines; and first dimensions of the first conductor are substantially equal to second dimensions of the second conductor, wherein third dimensions of the third conductor are different from fourth dimensions of the fourth conductor.

In Example 14, the subject matter of any one of Examples 11-13, wherein: a first distance between the first reference layer and the first conductor is substantially equal to a second distance between the second reference layer and the second conductor; the first conductor and the second conductor are substantially centered about the third conductor and the fourth conductor; the third conductor and the fourth conductor are substantially centered about the first conductor and the second conductor; the first reference layer and the second reference layer are ground layers; and first reference layer and the second reference layer are substantially symmetrical.

In Example 15, the subject matter of any one of Examples 11-14, wherein the first component is coupled to the second component via the first conductor and the second conductor.

In Example 16, the subject matter of any one of Examples 11-15 further comprising a third component, a fourth component, and a fifth component, wherein the first component is coupled to the second component via the first conductor, the first component is coupled to the third component via the second conductor, the first component is coupled to the fourth component via the third conductor, and the first component is coupled to the fifth component via the fourth conductor.

Example 17 is a circuit board comprising: a first socket; a second socket; and an interconnect connecting the first socket and the second socket, the interconnect comprising: a first reference layer; a second reference layer disposed below the first reference layer; a dielectric disposed between the first reference layer and the second reference layer; a first pair of conductors comprising a first conductor and a second conductor that are broadside-coupled within the dielectric below the first reference layer and above the second reference layer; and a second pair of conductors comprising a third conductor and a fourth conductor that are edge-coupled within the dielectric below the first conductor and above the second conductor.

In Example 18, the subject matter of Example 17, wherein: the first conductor and the second conductor are differential striplines; the third conductor and the fourth conductor are differential striplines; and first dimensions of the first conductor are substantially equal to second dimensions of the second conductor, wherein third dimensions of the third conductor are substantially equal to fourth dimensions of the fourth conductor.

In Example 19, the subject matter of any one of Examples 17-18, wherein: the first conductor and the second conductor are differential striplines; the third conductor and the fourth conductor are single-ended striplines; and first dimensions of the first conductor are substantially equal to second dimensions of the second conductor, wherein third dimensions of the third conductor are different from fourth dimensions of the fourth conductor.

In Example 20, the subject matter of any one of Examples 17-19, wherein: a first distance between the first reference layer and the first conductor is substantially equal to a second distance between the second reference layer and the second conductor; the first conductor and the second conductor are substantially centered about the third conductor and the fourth conductor; the third conductor and the fourth conductor are substantially centered about the first conductor and the second conductor; the first reference layer and the second reference layer are ground layers; and the first reference layer and the second reference layer are substantially symmetrical.

Various embodiments can have different combinations of the structural features described above. For instance, all optional features of the computing system described above can also be implemented with respect to the method or process described herein and specifics in the examples can be used anywhere in one or more embodiments.

While the present disclosure has been described with respect to a limited number of embodiments, those skilled in the art will appreciate numerous modifications and variations therefrom. It is intended that the appended claims cover all such modifications and variations as fall within the true spirit and scope of this present disclosure.

In the description herein, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler embodiments, specific expression of algorithms in code, specific power down and gating techniques/logic and other specific operational details of computer system have not been described in detail in order to avoid unnecessarily obscuring the present disclosure.

The embodiments may be described with reference to components in high speed I/O (HSIO) devices in specific integrated circuits, such as in computing platforms or microprocessors. The embodiments can also be applicable to other types of integrated circuits and programmable logic devices. For example, the disclosed embodiments are not limited to desktop computer systems or portable computers, such as the Intel® Ultrabooks™ computers, and can be also used in other devices, such as handheld devices, tablets, other thin notebooks, systems on a chip (SoC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. It is described that the system can be any kind of computer or embedded system. The disclosed embodiments can especially be used for low-end devices, like wearable devices (e.g., watches), electronic implants, sensory and control infrastructure devices, controllers, supervisory control and data acquisition (SCADA) systems, or the like. Moreover, the apparatuses, methods, and systems described herein are not limited to physical computing devices, but can also relate to software optimizations for energy conservation and efficiency. As will become readily apparent in the description below, the embodiments of methods, apparatuses, and systems described herein (whether in reference to hardware, firmware, software, or a combination thereof) are vital to a 'green technology' future balanced with performance considerations.

Although the embodiments herein are described with reference to a processor, other embodiments are applicable to other types of integrated circuits and logic devices. Similar techniques and teachings of embodiments of the present disclosure can be applied to other types of circuits or semiconductor devices that can benefit from higher pipeline throughput and improved performance. The teachings of embodiments of the present disclosure are applicable to any processor or machine that performs data manipulations. However, the present disclosure is not limited to processors or machines that perform 512 bit, 256 bit, 128 bit, 64 bit, 32 bit, or 16 bit data operations and can be applied to any processor and machine in which manipulation or management of data is performed. In addition, the description herein provides examples, and the accompanying drawings show various examples for the purposes of illustration. However, these examples should not be construed in a limiting sense as they are merely intended to provide examples of embodiments of the present disclosure rather than to provide an exhaustive list of all possible embodiments of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) can refer to the combination of the microcontroller and the non-transitory medium. Often module boundaries that are illustrated as separate commonly vary and potentially overlap. For example, a first and a second module can share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate can provide a 0 or a 1 during operation. But a logic gate 'configured to' provide an enable signal to a clock does not include every potential logic gate that can provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics can be combined in any suitable manner in one or more embodiments.

In the foregoing specification, a detailed description has been given with reference to specific exemplary embodiments. It will, however, be evident that various modifications and changes can be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but can refer to different and distinct embodiments, as well as potentially the same embodiment.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "carrying," "coupling," "transmitting," "receiving," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form.

Moreover, use of the term "an embodiment" or "one embodiment" or "an implementation" or "one implementation" throughout is not intended to mean the same embodiment or implementation unless described as such. Also, the terms "first," "second," "third," "fourth," etc. as used herein are meant as labels to distinguish among different elements and can not necessarily have an ordinal meaning according to their numerical designation.

What is claimed is:

1. An interconnect comprising:
a first reference layer;
a second reference layer disposed below the first reference layer;
a dielectric disposed between the first reference layer and the second reference layer;
a first pair of conductors comprising a first conductor and a second conductor that are in a broadside-facing orientation within the dielectric below the first reference layer and above the second reference layer; and
a second pair of conductors comprising a third conductor and a fourth conductor that are in an edge-facing orientation within the dielectric, wherein the second conductor is disposed above the second reference layer, the second pair of conductors are disposed above the second conductor, the first conductor is disposed above the second pair of conductors, and the first reference layer is disposed above the first conductor.

2. The interconnect of claim 1, wherein:
the first conductor and the second conductor are first differential striplines;
the third conductor and the fourth conductor are second differential striplines;
first dimensions of the first conductor are substantially equal to second dimensions of the second conductor; and
third dimensions of the third conductor are substantially equal to fourth dimensions of the fourth conductor.

3. The interconnect of claim 1, wherein:
the first conductor and the second conductor are differential striplines;
the third conductor and the fourth conductor are single-ended striplines;
first dimensions of the first conductor are substantially equal to second dimensions of the second conductor; and
third dimensions of the third conductor are different from fourth dimensions of the fourth conductor.

4. The interconnect of claim 1, wherein a first distance between the first reference layer and the first conductor is substantially equal to a second distance between the second reference layer and the second conductor.

5. The interconnect of claim 1, wherein a central point is between the first conductor and the second conductor, wherein a first distance between the third conductor and the central point is substantially equal to a second distance between the fourth conductor and the central point.

6. The interconnect of claim 1, wherein a central point is between the third conductor and the fourth conductor, wherein a first distance between the first conductor and the central point is substantially equal to a second distance between the second conductor and the central point.

7. The interconnect of claim 1, wherein:
the first conductor and the second conductor are substantially centered about the third conductor and the fourth conductor;
the third conductor and the fourth conductor are substantially centered about the first conductor and the second conductor; and
the first reference layer and the second reference layer are substantially symmetrical.

8. The interconnect of claim 1, wherein:
a lower surface of the first conductor is separated from an upper surface of the second conductor by the dielectric;
a first edge surface of the third conductor is separated from a second edge surface of the fourth conductor by the dielectric;
the upper surface and the lower surface are substantially parallel with the first reference layer and the second reference layer; and
the first edge surface and the second edge surface are substantially perpendicular to the first reference layer and the second reference layer.

9. The interconnect of claim 1, wherein each of the first conductor, the second conductor, the third conductor, and the fourth conductor is to carry a corresponding signal that changes state at a corresponding frequency of at least one megahertz (MHz).

10. The interconnect of claim 1, wherein the first conductor and the second conductor are broadside-coupled, and wherein the third conductor and the fourth conductor are in edge-coupled.

11. A system comprising:
a first component;
a second component; and
a conductor system coupled between the first component and the second component, wherein the conductor system comprises:
a first reference layer;
a second reference layer disposed below the first reference layer;
a dielectric disposed between the first reference layer and the second reference layer;
a first pair of conductors comprising a first conductor and a second conductor that are broadside-coupled within the dielectric below the first reference layer and above the second reference layer; and
a second pair of conductors comprising a third conductor and a fourth conductor that are edge-coupled within the dielectric, wherein the second conductor is disposed above the second reference layer, the second pair of conductors are disposed above the second conductor, the first conductor is disposed above the second pair of conductors, and the first reference layer is disposed above the first conductor.

12. The system of claim 11, wherein:
the first conductor and the second conductor are first differential striplines;
the third conductor and the fourth conductor are second differential striplines; and
first dimensions of the first conductor are substantially equal to second dimensions of the second conductor, wherein third dimensions of the third conductor are substantially equal to fourth dimensions of the fourth conductor.

13. The system of claim 11, wherein:
the first conductor and the second conductor are differential striplines;
the third conductor and the fourth conductor are single-ended striplines; and
first dimensions of the first conductor are substantially equal to second dimensions of the second conductor, wherein third dimensions of the third conductor are different from fourth dimensions of the fourth conductor.

14. The system of claim 11, wherein:
a first distance between the first reference layer and the first conductor is substantially equal to a second distance between the second reference layer and the second conductor;
the first conductor and the second conductor are substantially centered about the third conductor and the fourth conductor;
the third conductor and the fourth conductor are substantially centered about the first conductor and the second conductor;
the first reference layer and the second reference layer are ground layers; and
the first reference layer and the second reference layer are substantially symmetrical.

15. The system of claim 11, wherein the first component is coupled to the second component via the first conductor and the second conductor.

16. The system of claim 11 further comprising a third component, a fourth component, and a fifth component, wherein the first component is coupled to the second component via the first conductor, the first component is coupled to the third component via the second conductor, the first component is coupled to the fourth component via the third conductor, and the first component is coupled to the fifth component via the fourth conductor.

17. A circuit board comprising:
a first socket;
a second socket; and
an interconnect connecting the first socket and the second socket, the interconnect comprising:
a first reference layer;
a second reference layer disposed below the first reference layer;
a dielectric disposed between the first reference layer and the second reference layer;
a first pair of conductors comprising a first conductor and a second conductor that are broadside-coupled within the dielectric below the first reference layer and above the second reference layer; and
a second pair of conductors comprising a third conductor and a fourth conductor that are edge-coupled within the dielectric, wherein the second conductor is disposed above the second reference layer, the second pair of conductors are disposed above the second conductor, the first conductor is disposed above the second pair of conductors, and the first reference layer is disposed above the first conductor.

18. The circuit board of claim 17, wherein:
the first conductor and the second conductor are first differential striplines;
the third conductor and the fourth conductor are second differential striplines; and
first dimensions of the first conductor are substantially equal to second dimensions of the second conductor, wherein third dimensions of the third conductor are substantially equal to fourth dimensions of the fourth conductor.

19. The circuit board of claim 17, wherein:
the first conductor and the second conductor are differential striplines;
the third conductor and the fourth conductor are single-ended striplines; and
first dimensions of the first conductor are substantially equal to second dimensions of the second conductor, wherein third dimensions of the third conductor are different from fourth dimensions of the fourth conductor.

20. The circuit board of claim 17, wherein:
a first distance between the first reference layer and the first conductor is substantially equal to a second distance between the second reference layer and the second conductor;
the first conductor and the second conductor are substantially centered about the third conductor and the fourth conductor;
the third conductor and the fourth conductor are substantially centered about the first conductor and the second conductor;
the first reference layer and the second reference layer are ground layers; and
the first reference layer and the second reference layer are substantially symmetrical.

* * * * *